United States Patent
Takenaka

[11] Patent Number: 6,144,055
[45] Date of Patent: Nov. 7, 2000

[54] SEMICONDUCTOR MEMORY DEVICE

[75] Inventor: Hiroyuki Takenaka, Kamakura, Japan

[73] Assignee: Kabushiki Kaisha Toshiba, Kawasaki, Japan

[21] Appl. No.: 08/966,479

[22] Filed: Nov. 7, 1997

Related U.S. Application Data

[63] Continuation of application No. 08/613,579, Mar. 12, 1996, abandoned.

[30]     Foreign Application Priority Data

Mar. 15, 1995  [JP]  Japan ................................. 7-055471

[51] Int. Cl.$^7$ .................................................. H01L 31/119
[52] U.S. Cl. ........................................... 257/301; 257/758
[58] Field of Search ..................... 257/310, 750, 257/758; 438/243

[56]              References Cited

U.S. PATENT DOCUMENTS

| | | | |
|---|---|---|---|
| 4,918,502 | 4/1990 | Kaga et al. | 257/304 |
| 5,151,772 | 9/1992 | Takahashi et al. | 257/758 |
| 5,336,912 | 8/1994 | Ohtsuki | 257/301 |
| 5,452,244 | 9/1995 | Mohan Rao | 365/149 |
| 5,502,320 | 3/1996 | Yamada | 257/302 |
| 5,544,101 | 8/1996 | Houston | 365/189.02 |
| 5,600,591 | 2/1997 | Takagi | 365/184 |
| 5,691,550 | 11/1997 | Kohyama | 257/301 |
| 5,867,446 | 2/1999 | Konishi et al. | 365/233 |
| 5,874,332 | 2/1999 | Ema | 438/239 |

FOREIGN PATENT DOCUMENTS

| | | |
|---|---|---|
| 607547 A1 | 7/1994 | European Pat. Off. . |
| 63-136558 | 6/1988 | Japan . |
| 63-136559 | 6/1988 | Japan . |

OTHER PUBLICATIONS

IEEE Transactions on Electron Device vol. 35, No. 8, Aug. 1988, pp. 1257–1263, "Half–Vcc Sheath Plate Capacitor DRAM Cell With Self–Aligned Buried Plate–Wiring," T. Kaga et al.

International Electron Devices Meeting 1993, A 0.6 $\mu m^2$ 256 Mb Trench DRAM Cell With Self–Aligned Buried Strap (BEST), L. Nesbit et al.

Weste et al. "Principles of CMOS VLSI Design," plate 13, 1995.

*Primary Examiner*—Sara Crane
*Attorney, Agent, or Firm*—Banner & Witcoff, Ltd.

[57]              ABSTRACT

A dynamic memory device includes a buried plate-wiring connected to a plate electrode of a memory cell. A plate potential is supplied to the buried plate-wiring via a plate potential supply-wiring. A connection node of the buried plate-wiring and the plate potential supply-wiring is arranged at a side of the memory cell array opposed to a side of a row decoder array.

21 Claims, 22 Drawing Sheets

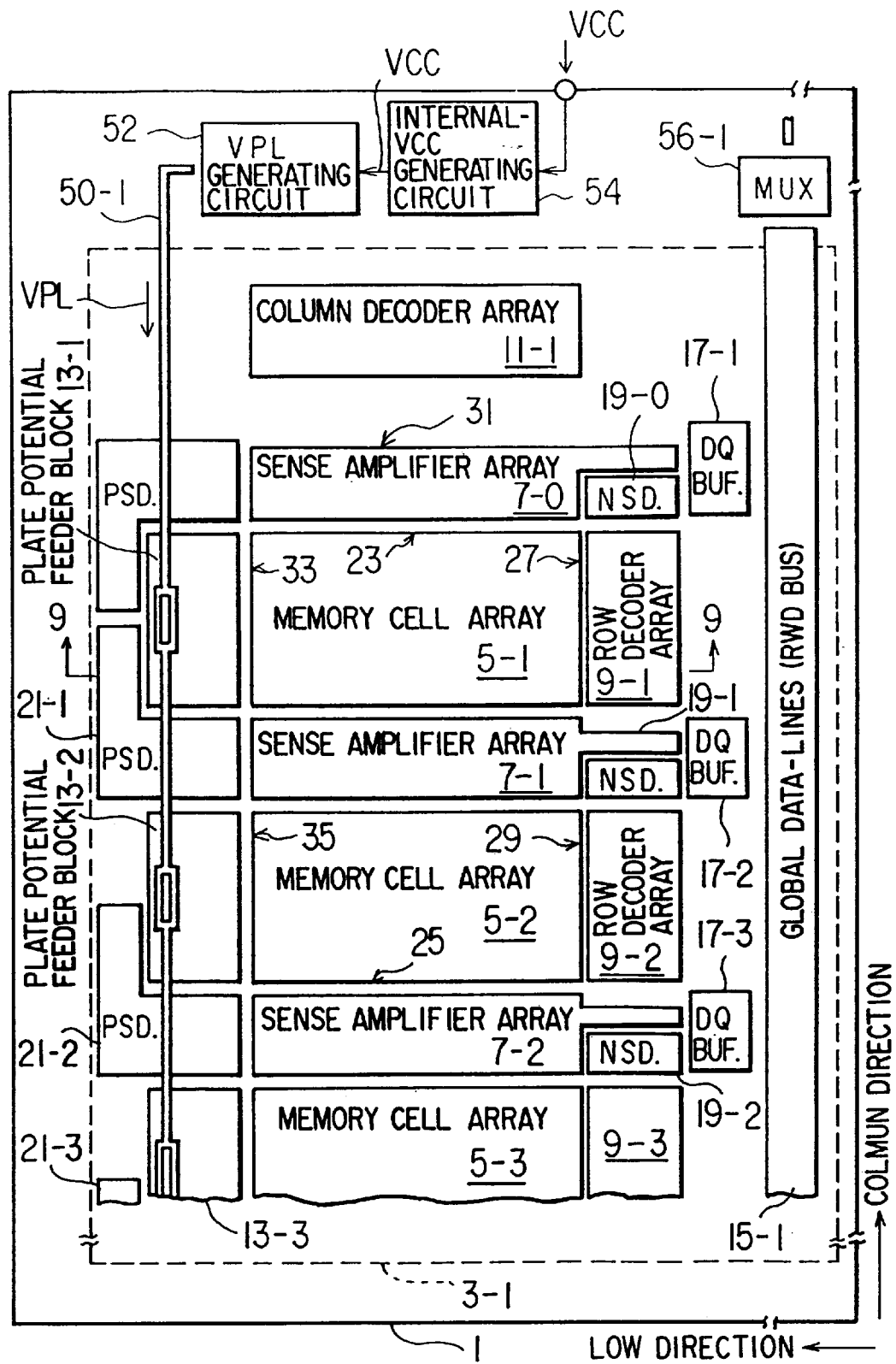
F I G. 1

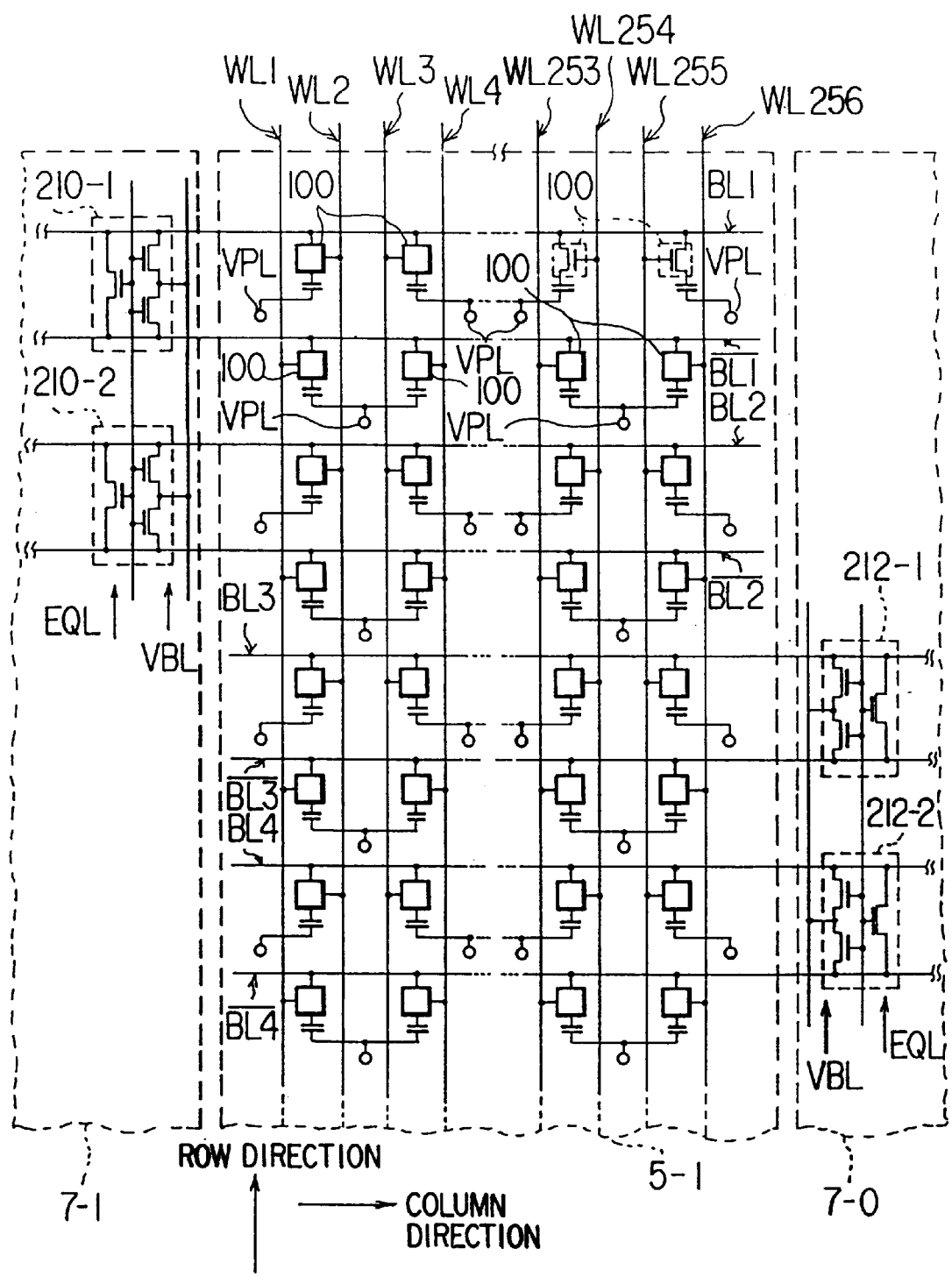
F I G. 2

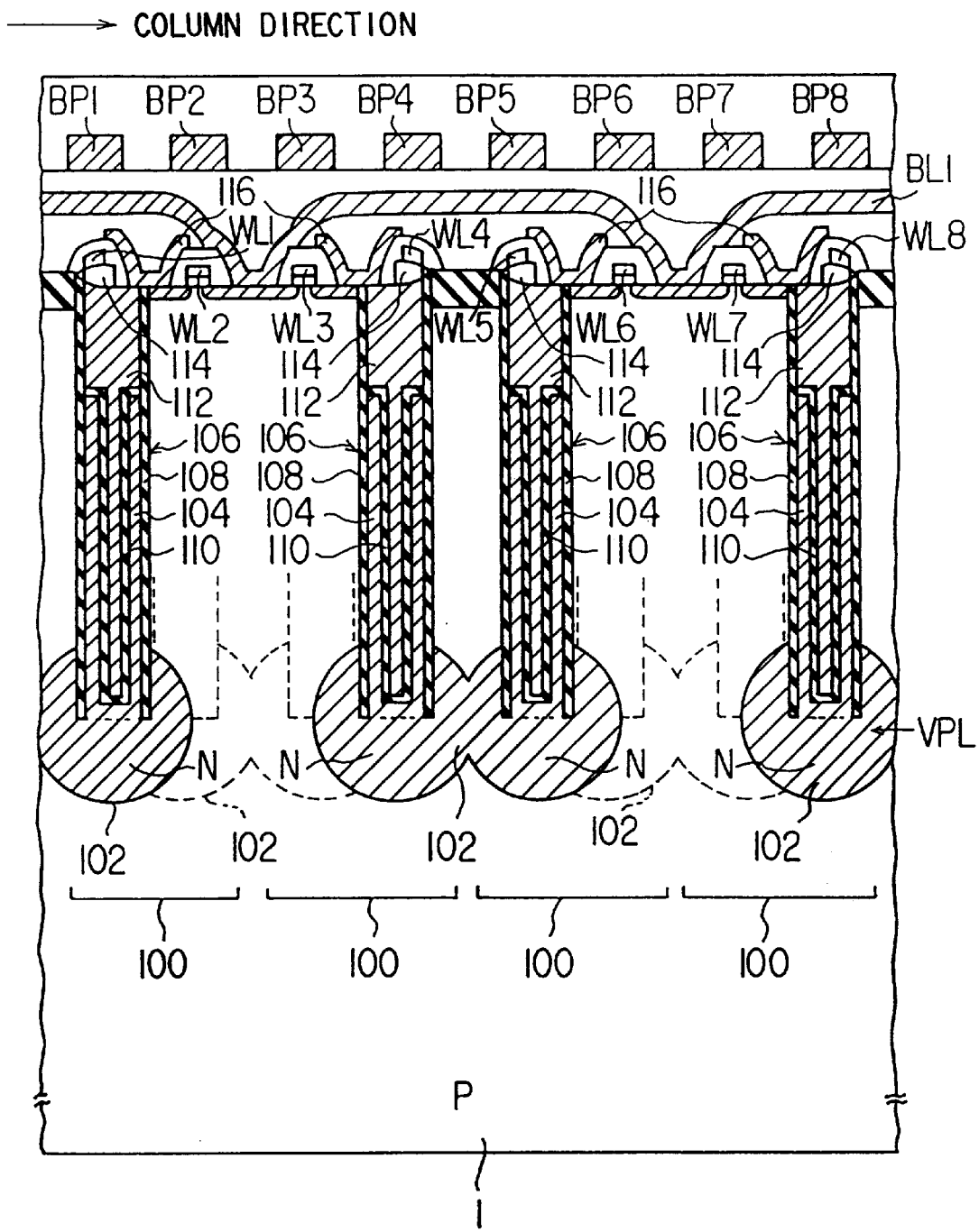
F I G. 3

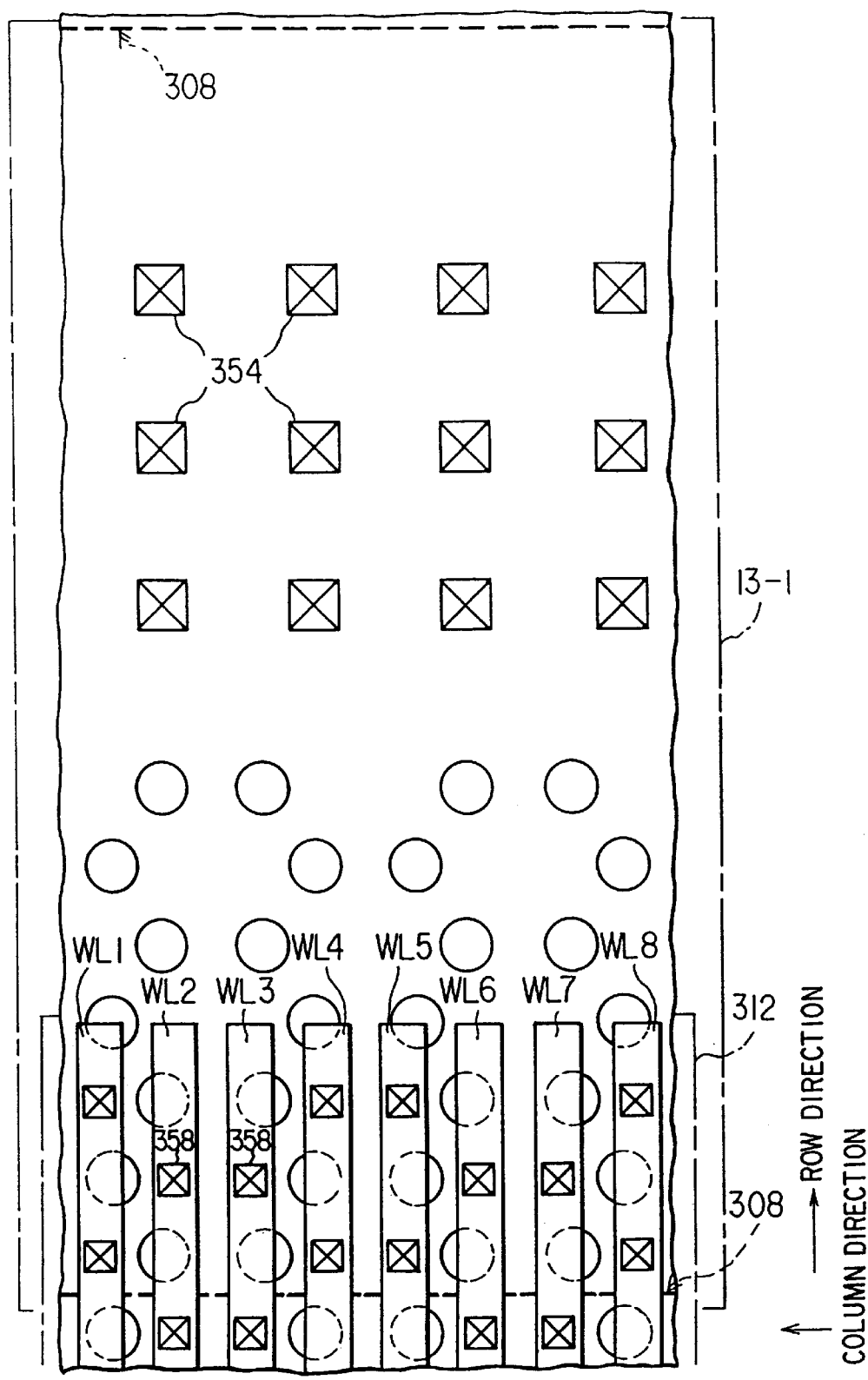
F I G. 16

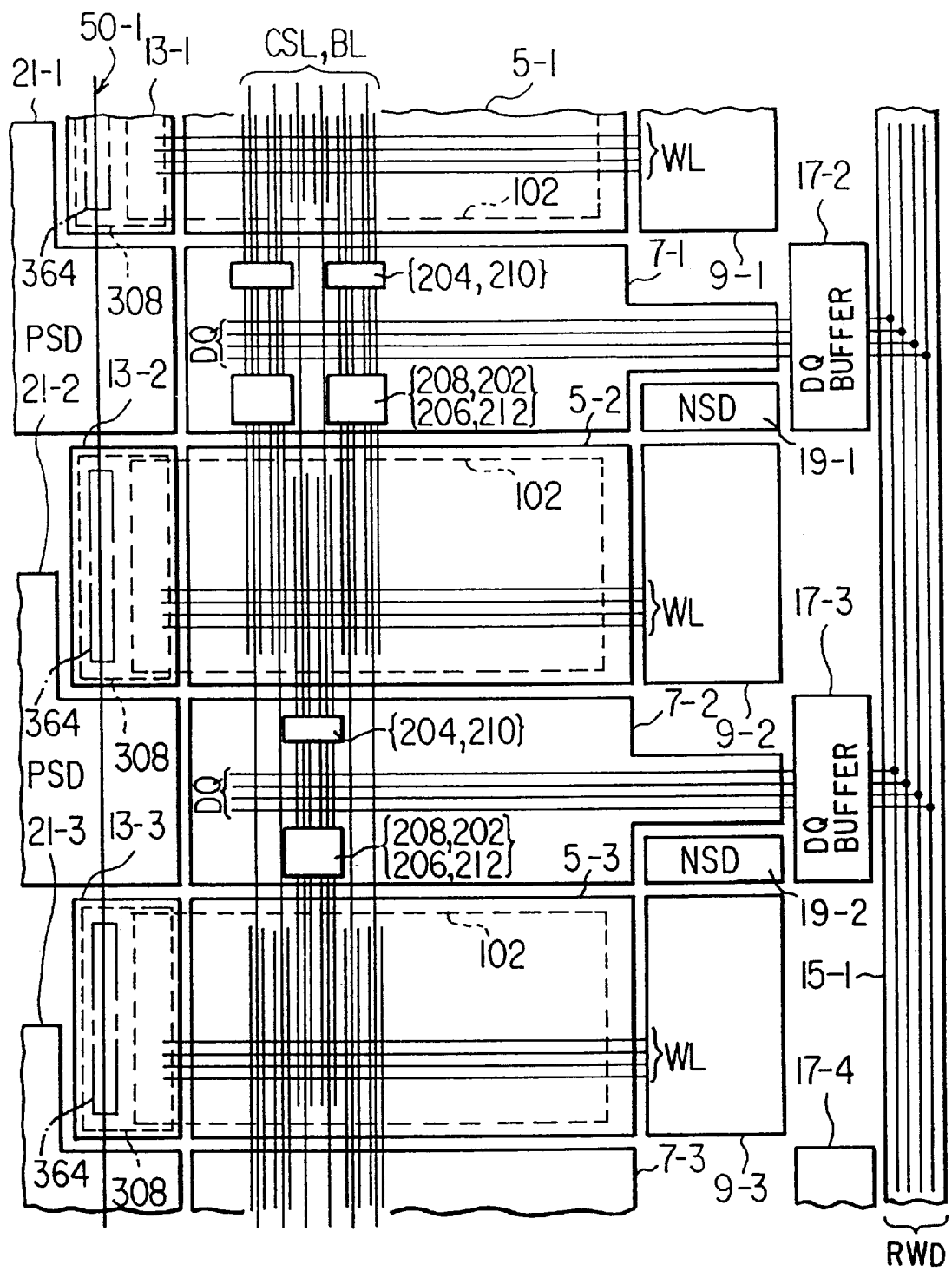
F I G. 20

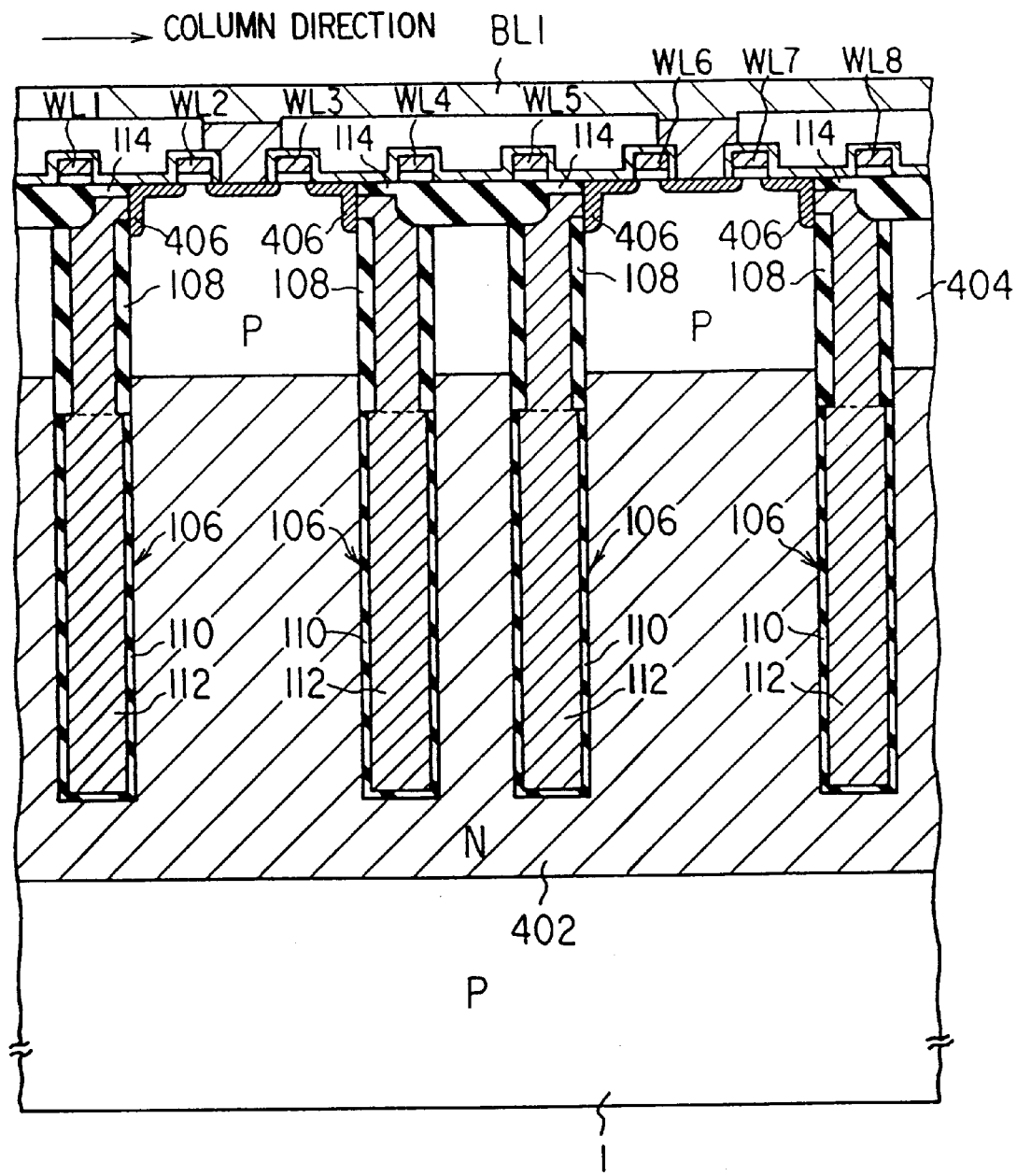
F I G. 21

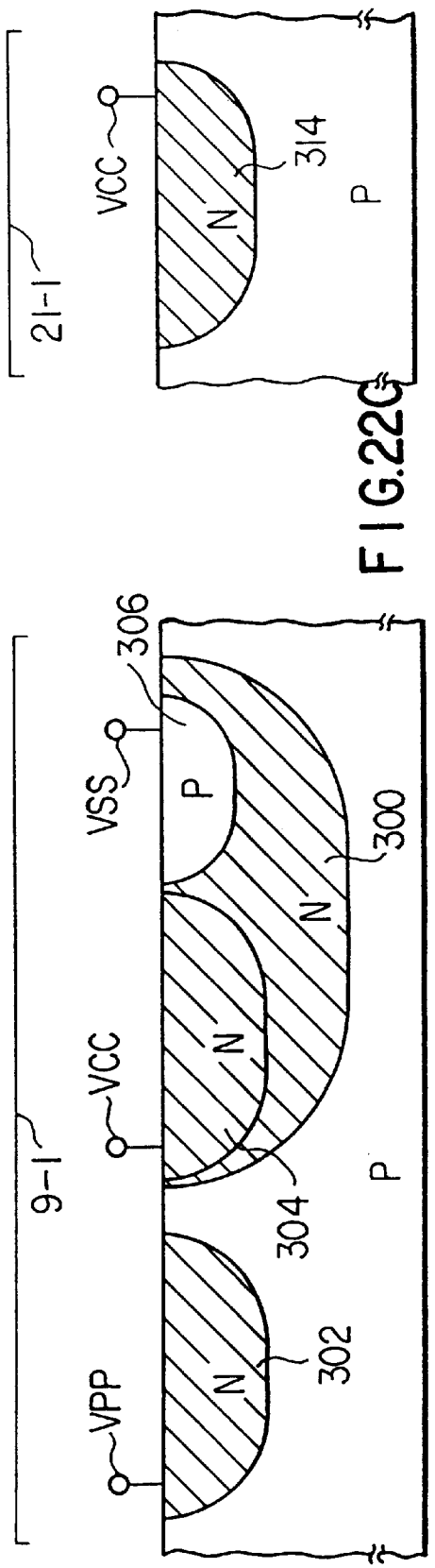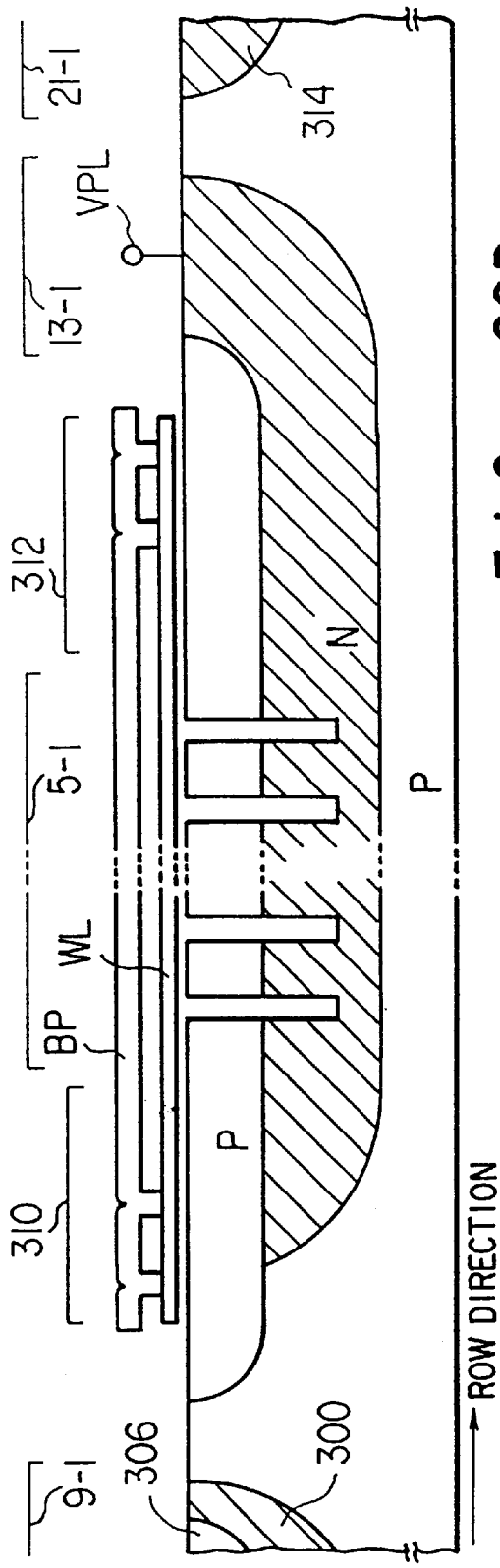
FIG. 22A
FIG. 22B
FIG. 22C

SEMICONDUCTOR MEMORY DEVICE

This application is a continuation of application Ser. No. 08/613,579, filed Mar. 12, 1996, now abandoned.

BACKGROUND OF THE INVENTION

1. Field of the Invention

The present invention relates to a semiconductor memory device and, more particularly, to a semiconductor memory device that has a memory cell with a buried plate-wiring.

2. Description of the Related Art

A dynamic RAM has the highest integration density of elements of semiconductor products. Therefore, the miniaturization of the element has been developed among all the semiconductor products. Particularly, the memory cell is always the latest of the miniaturization technique.

The basic configuration of the micro memory cell is largely classified to two, which are a stack capacitor cell and a trench capacitor cell. However, as the miniaturization is advanced, there have been the following problems in both the stack capacitor cell and the trench capacitor cell.

In the stack capacitor cell, a storage node is formed on a substrate, and a cell plate is stacked on the storage node. Therefore, since the flatness of the layer formed on the substrate is deteriorated, the further miniaturization has become difficult.

In the trench capacitor cell, a cell to cell space was limited due to the leakage current which could result in punch through between adjacent trenches. Therefore, the further miniaturization has become difficult similarly to the stack capacitor cell.

Accordingly, a Buried Plate Trench capacitor cell (BPT cell) has been developed to eliminate these problems.

The BPT cell is disclosed in Japanese Patent Application KOKAI Publication No. 63-136558 and "Half-Vcc Sheath-Plate Capacitor DRAM Cell with Self-Aligned Buried Plate-Wiring, T. Kaga et al., IEEE TRANSACTIONS ON ELECTRON DEVICES VOL. 35, No. 8, August 1988, p1257–p1263", etc.

The essential points of the BPT cell will be simply explained.

The BPT cell can exclude plates from the substrate to connect the plates formed in the trench in the substrate. Therefore, the flatness of the layer formed on the substrate is improved.

Since the storage node is formed in the trench and an oxide film collar is formed inside the trench to insulate the storage node from the substrate, the interval between the trenches can be reduced as compared with the trench capacitor cell.

The BPT cell is more easily miniaturized as compared with both the stack capacitor cell and the trench capacitor cell.

However, when the BPT cell is used in the actual dynamic RAM, several problems have been discovered.

Since the BPT cell connects the plates in the substrate, a wiring (hereinafter referred to as a "buried plate-wiring") is required in the substrate. Therefore, the actual dynamic RAM causes a problem of where of a chip a plate potential feeder for feeding a plate potential to buried plate-wiring via a plate potential supply-wiring is located.

The layout of the basic block (memory arrays, row circuits, column circuits, sense amplifiers, column gates, etc.) of the dynamic RAM has been substantially completed from the standpoint of obtaining the best integration density.

However, when the BPT cell is intended to be actually used for the dynamic RAM, the entirely new block of a connection node the plate potential supply-wiring to the buried plate-wiring is to be added to the substantially completed layout.

If the selection of the placing location is mistaken in the newly added block, it might disturb its integration density.

A method of connecting a plate potential supply-wiring to a buried plate-wiring was disclosed in Japanese Patent Application KOKAI Publication Nos. 63-136559 and 6-29485 and the above-described "Half-Vcc Sheath-Plate Capacitor DRAM Cell with Self-Aligned Buried Plate-Wiring., T. Kaga et al., IEEE TRANSACTIONS ON ELECTRON DEVICES VOL. 35, No. 8, August 1988, p1257–p1263", but there has been no report at present as to where of the chip the connection node is provided.

SUMMARY OF THE INVENTION

An object of the present invention is to provide a semiconductor memory device which has the connection node of a plate potential supply-wiring to a buried plate-wiring so as not to disturb the integration density.

The other object of the invention is to provide a semiconductor memory device in which the potential change of a buried plate-wiring is reduced.

To accomplish the foregoing object, according to one preferred aspect of the present invention, a semiconductor memory device includes a buried plate-wiring connected to a plate of a memory cell. A plate potential is supplied to the buried plate-wiring via a plate potential supply-wiring (or a plate potential feeding-wiring). A connection node of the buried plate-wiring and the supply-wiring is arranged at a side of the memory cell array opposed to a side of a row circuit array. The connection node includes a plate potential feeder for feeding the plate potential to the buried plate-wiring via the supply-wiring. The row circuit array includes a row decoder and a word-line driver. Thus, the integration density of the semiconductor memory device in a column direction is not disturbed. Therefore, the semiconductor memory device having a connection node of the buried plate-wiring and the supplying-wiring not to disturb the integration density is obtained.

Further, to accomplish the other object of the invention, according to the other preferred aspect of the invention, a semiconductor memory device includes a first buried plate-wiring and a second buried plate-wiring. The first buried plate-wiring is connected to plates of memory cells included in a first memory cell array. The second buried plate-wiring is connected to plates of memory cells included in a second memory cell array. A plate potential is supplied to the first and second buried plate-wiring via a plate potential supply-wiring. Thus, the first and second buried plate-wirings are not connected to each other in a bulk of a semiconductor substrate. Therefore, the transmission of electrical noise between the memory cell array to memory cell array is eliminated. Further, degree of a variation of the plate potential of the buried plate-wiring is decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram showing the portion of a memory core of a dynamic RAM according to a first embodiment of the present invention;

FIG. 2 is a circuit diagram of the memory cell array shown in FIG. 1;

FIG. 3 is a sectional view of the memory cell shown in FIG. 2;

FIG. 9A is a sectional view of a row decoder array, FIG. 9B is a sectional view of the memory cell array and a plate potential feeder block, and FIG. 9C is a sectional view of a P-channel type sense amplifier driving circuit block;

FIG. 16 is a plan view showing up to the first polysilicon layer of the plate potential feeder block shown in FIG. 10;

FIG. 20 is a view showing in detail the block shown in FIG. 1;

FIG. 21 is a sectional view of a BEST cell; and

FIGS. 22A to 22C are sectional views when the BEST cell is used for the memory cell array shown in FIG. 1; FIG. 22A is a sectional view of the row decoder array, FIG. 22B is a sectional view of the memory cell array and the plate potential feeder block, and FIG. 22C is a P-channel type sense amplifier driving circuit block.

DETAILED DESCRIPTION OF THE PREFERRED EMBODIMENTS

Figure 4:
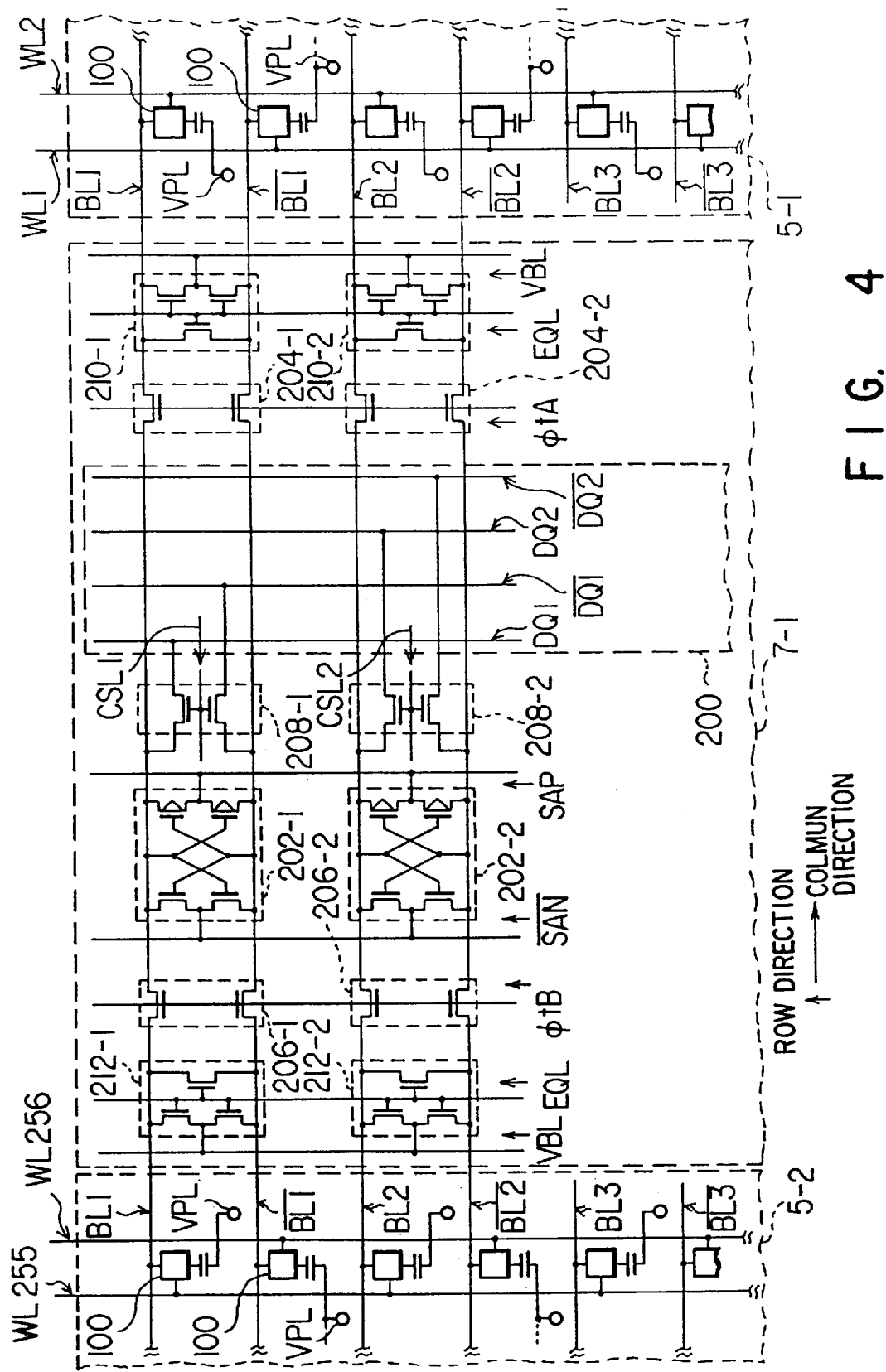
FIG. 4 is a circuit diagram of a sense amplifier array shown in FIG. 1.

Hereinafter, embodiments of the present invention will be explained in detail. In the description, like reference numerals designate like or corresponding parts throughout the accompanying drawings to avoid the duplicate descriptions.

FIG. 1 is a block diagram showing the portion of the dynamic RAM according to a first embodiment of the present invention.

As shown in FIG. 1, a first memory core 3-1 is placed on a silicon substrate (chip) 1. The memory core 3-1 fundamentally includes memory cell arrays 5-1, 5-2, . . . , in which memory cells are integrated in a matrix state, sense amplifier arrays 7-0, 7-1, . . . , row decoder arrays 9-1, 9-2, . . . , provided in each memory cell array 3, plate potential feeder blocks 13-1, 13-2, . . . , provided in each memory cell array 3, a common column decoder 11-1 in each memory cell array 3, global data-lines (RWD bus) 15-1, DQ buffers (DQBUF.) 17-1, 17-2, . . . , for connecting the sense amplifier arrays 7 to the RWD bus 15-1, N-channel type sense amplifier driving circuit blocks (NSD.) 19-0, 19-1, . . . , and P-channel type sense amplifier driving circuit blocks (PDS.) 21-0, 21-1.

The above-described blocks will be sequentially explained.

First, the memory cell array will be explained.

The first memory cell array 5-1 is located adjacent to the second memory cell array 5-2.

FIG. 2 is a circuit diagram of the memory cell array 5-1.

As shown in FIG. 2, the memory cell array 5-1 has, for example, 256 word-lines WL and 512 pairs of bit-line pairs BL, /BL (where "/" of the head signifies "-" (bar), which designates an inversion signal. In FIG. 2, when "-" (bar) is added above the reference characters) it includes dynamic memory cells 100 provided at the intersections of the word-lines WL and the bit-lines BL or the bit-lines /BL.

FIG. 3 is a sectional view of the memory cell 100.

As shown in FIG. 3, the memory cell 100 of the dynamic RAM according to this embodiment is a BPT cell. The BPT cell will be simply explained. An N-type buried plate-wiring 102 for connecting plates 104 to each other in the substrate 1 is formed in the P-type silicon substrate 1. A plate potential VPL is applied to the buried plate-wiring 102. The plate potential VPL is, for example, ½ (half VCC) of a power source potential VCC. The plate 104 is formed in a trench 106, which is provided in each BPT cell 100. A silicon oxide film ($SiO_2$) 108 is formed in a collar state on the sidewall of the trench 106. Contrary, the bottom of the trench 106 is connected with the buried plate-wiring 102. The plate 104 is formed in a sheath state along the bottom of the trench 106 and the silicon oxide film 108. The plate 104 is insulated from the substrate 1 by the silicon oxide film 108, and electrically connected to the buried plate-wiring 102 through the bottom of the trench 106. A capacitor dielectric film 110 is formed on the surface of the plate 104. The interior of the sheath formed of the plate 104 is buried with a storage node 112. The storage node 112 is formed up to the surface of the substrate 1 along the silicon oxide film 108 from the interior of the sheath while being insulated from the substrate 1 by the silicon oxide film 108. The storage node 112 is capacitively coupled to the plate 104 through the capacitor dielectric film 110. The cover of a silicon oxide film 114 is formed on the surface of the storage node 112. An opening is provided at the silicon oxide film 114. A connecting member 116 for connecting the storage node 112 to the source of a cell transistor is formed in the opening. The connecting member 116 is formed, for example, of conductive polysilicon.

The foregoing description is the general description of the BPT cell. The cell transistor is substantially the same as prior. art. For instance, the word-line WL is formed between the source of the cell transistor and the drain of the cell transistor on the substrate 1, and the drain of the cell transistor is connected to the bit-line BL (/BL).

In FIG. 3, reference characters BP1 to BP8 denote bypass word-lines for reducing the resistances of the word-lines WL. The word-line WL is formed of conductive polysilicon. The bypass word-line is formed of metal which contains as a main ingredient aluminum having a lower resistance value than that of the conductive polysilicon.

In the other memory cell arrays 5-2, 5-3, . . . , BPT cells shown in FIG. 3 are integrated in a matrix state similarly to the memory cell array 5-1. The memory cell arrays 5-2, 5-3, . . . , are formed in circuits shown in FIG. 2 similarly to the memory cell array 5-1.

The first sense amplifier array 7-1 is placed between the memory cell array 5-1 and the memory cell array 5-2. The sense amplifier array 7-1 fundamentally includes a first sense amplifier group electrically connected to the BPT cell group integrated with the memory cell array 5-1, a second sense amplifier group electrically connected to the BPT cell group integrated with the memory cell array 5-2, a first DQ-line group electrically connected to the first sense amplifier group, and a second DQ-line group electrically connected to the first sense amplifier group, and a second DQ-line group electrically connected to the second sense amplifier group.

The sense amplifier array 7-1 in the DRAM according to the first embodiment has a shared sense amplifier type for sharing two memory cell arrays with the one sense amplifier group and the one DQ-line group to enhance the integration density of the column direction shown by an arrow in FIG. 1.

FIG. 4 is a circuit diagram of the sense amplifier array 7-1.

As shown in FIG. 4, the sense amplifier array 7-1 has one data line group (local data-lines: DQ bus) 200, cross-coupling CMOS sense amplifiers 202-1, 202-2, . . . , connected between the bit-lines BL and inversion bit-lines /BL, first $\phi$t gates 204-1, 204-2, . . . , respectively inserted to the bit-line BL and the inversion bit-line /BL between the sense amplifier 202 and the memory cell array 5-1, second $\phi$t gates 206-1, 206-2, . . . , respectively inserted to the bit-line BL and the inversion bit-line /BL between the sense amplifier 202 and the memory cell array 5-2, column gates 208-1, 208-2, . . . , connected to the bit-line BL and the inversion bit-line /BL between the first $\phi$t gate 204 and the second $\phi$t gate 206, first bit-line equalizing circuit 210-1, 210-2, . . . , connected to the bit-line BL and the inversion bit-line /BL between the first $\phi$t gate 204 and the memory cell array 5-1, and second bit-line equalizing circuit 212-1, 212-2, . . . , connected to the bit-line BL and the inversion bit-line /BL between the second $\phi$t gate 206 and the memory cell array 5-2.

The sense amplifier 202 amplifies a potential difference between the bit-lines BL and /BL partitioned by the first $\phi$t gate 204 and the second $\phi$t gate 206 of the bit-line pair BL, /BL. The sense amplifier 202 is supplied with sense amplifier activation signals BSAN and SAP.

The signal BSAN is dropped from an equalizing potential to a VSS level when the sense amplifier is activated. Thus, a power source potential is input to the source of the N-channel sense amplifier. The equalizing potential is, for example, ½ (half VCC) of the power source potential VCC. The signal BSAN is output from the N-channel sense amplifier driving circuit formed in the block 19-1 shown in FIG. 1.

The signal SAP is raised from the equalizing potential to the VCC level when the sense amplifier is activated. Thus, the power source potential is input to the source of the P-channel sense amplifier. The equalizing potential is, for example, ½ (half VCC) of the power source potential VCC similarly to the signal BSAN. The signal SAP is output from the P-channel sense amplifier driving circuit formed in the block 21-1 shown in FIG. 1.

The $\phi$t gate 204 and the $\phi$t gate 206 prevent the data signal output from the memory cell array 5-1 and the data signal output from the memory cell array 5-2 from being collided on the bit-line pair BL and /BL when the data are read. Thus, the $\phi$t gate 204 and the $\phi$t gate 206 are turned on at either one and off at the other one when the data is read.

Further, the $\phi$t gate 204 and the $\phi$t gate 206 contains prevent the one data input out of the chip from being simultaneously written in the memory cell array 5-1 and the memory cell array 5-2 when the data is written. To this end, either the $\phi$t gate 204 or the $\phi$t gate 206 is turned on and off when the data is written. These controls are executed according to a signal $\phi$tA and a signal $\phi$tB.

The column gate 208 connects the bit-line pair BL, /BL connected by the $\phi$t gate 204 or the $\phi$t gate 206 to the data line DQ, the inversion data-line /DQ in response to a column select signal CSL. The column select signal CSL1 is supplied to the column gate 208-1 connected to the bit-line pair BL1, /BL1, and the column select signal CSL2 is supplied to the column gate 208-2 connected to the bit-line pair BL2, /BL2. The column select signal CSL1 and the column select signal CSL2 may be separate signals or signals of the same phase. The bit-line pair BL1, /BL1 is connected to the data-line pair DQ1, /DQ1, and the bit-line pair BL2, /BL2 is connected to the data-line pair DQ2, /DQ2. Thus, when the data are read, the data are not collided or the data are not be written in duplicate. These column select signals CSL are output from the column decoder 11-1 shown in FIG. 1.

The bit-line equalizing circuit 210 equalizes the potential difference between the bit-line pair BL and the inversion bit-line /BL of the memory cell array 5-1 in response to the bit-line equalizing signal EQL. The equalizing potential VBL is applied according to an equalizing circuit activation signal VBL. The equalizing potential VBL is a bit-line precharge potential, and is, for example, ½ (half VCC) of the power source potential VCC.

The bit-line equalizing circuit 212 equalizes the potential difference between the bit-line pair BL and the inversion bit-line /BL of the memory cell array 5-2 in response to the bit-line equalizing signal EQL. The circuit of the bit-line equalizing circuit 212 is similar to the equalizing circuit 210.

The second sense amplifier array 7-0 is placed adjacent to the side 23 of the memory cell array 5-1 opposed to the sense amplifier array 7-1. The sense amplifier array 7-0 fundamentally contains a third sense amplifier group electrically connected to the BPT cell group integrated in the memory cell array 5-1, and a third DQ-line group electrically connected to the third sense amplifier group.

Figure 5:
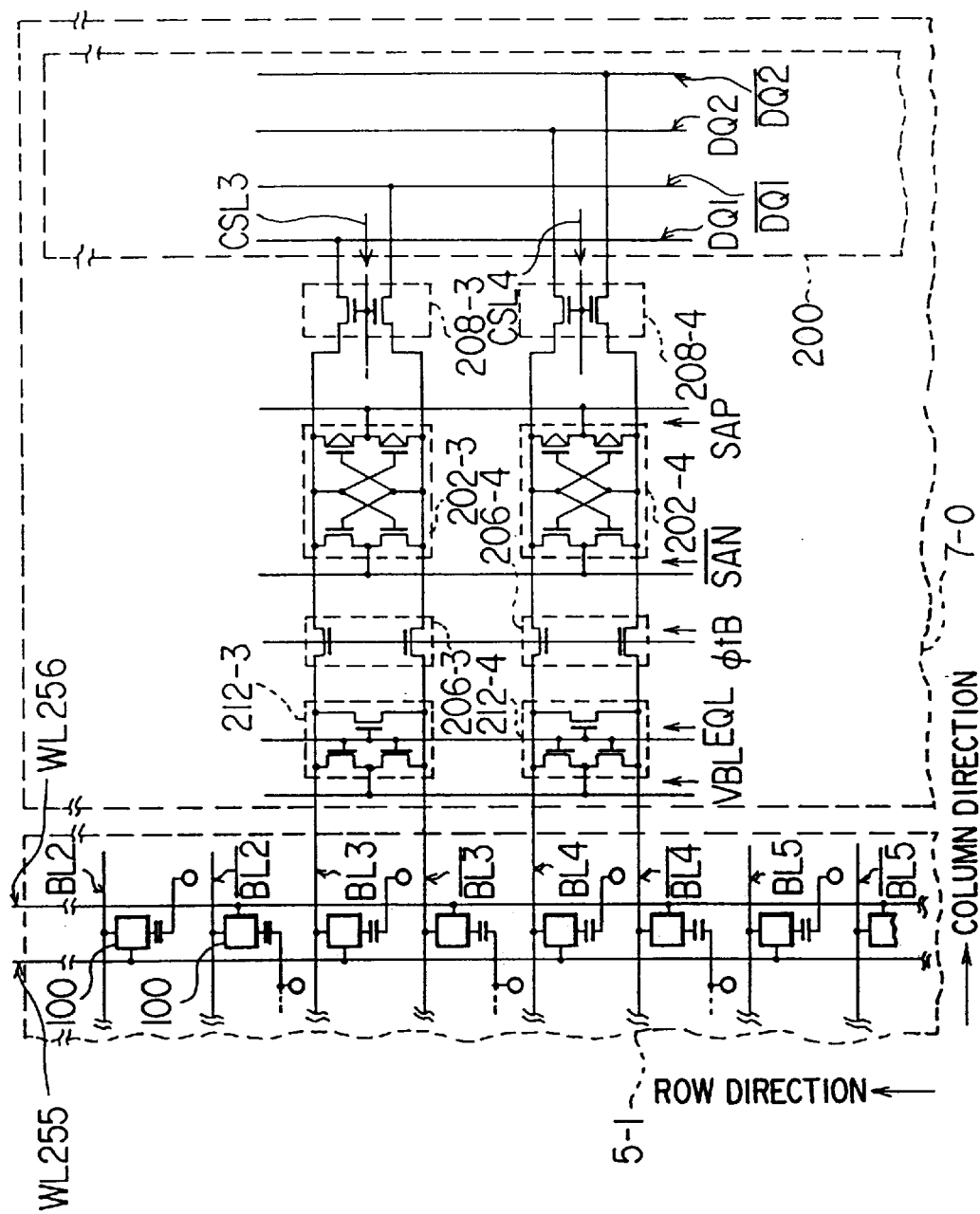
FIG. 5 is a circuit diagram of the sense amplifier array shown in FIG. 1.

FIG. 5 is a circuit diagram of the sense amplifier array 7-0.

As shown in FIG. 5, the sense amplifier array 7-0 is not a shared sense amplifier type. Because the sense amplifier array 7-0 is placed adjacent to the memory cell array 5-1 of the end. However, the sense amplifier array 7-0 includes, in addition to the sense amplifier 202, the column gate 208 and the bit-line equalizing circuit 212, the $\phi$t gate 206 peculiar for the shared sense amplifier type. Because the sense amplifier array 7-0 functions to match the circuit operation with the other sense amplifier array 7-1, etc.

The sense amplifier activation signals BSAN and SAP supplied to the sense amplifier 202 of the sense amplifier array 7-0 are respectively output from the N-channel type sense amplifier driving circuit formed in the block 19-0 and the P-channel type sense amplifier driving circuit formed in the block 21-0 shown in FIG. 1. Similarly, the column select signal CSL3 supplied to the column gate 208-3 of the sense amplifier array 7-0 and the column select signal CSL4 supplied to the column gate 208-4 are output from the column decoder array 11-1 shown in FIG. 1.

The third sense amplifier array 7-2 is placed adjacent to the side 25 of the memory cell array 5-2 opposed to the sense amplifier 7-1. The sense amplifier array 7-2 contains at least the fourth sense amplifier group electrically connected to the BPT cell group integrated with the memory cell array 5-1 and the fourth DQ-line group electrically connected to the fourth sense amplifier group.

Figure 6:
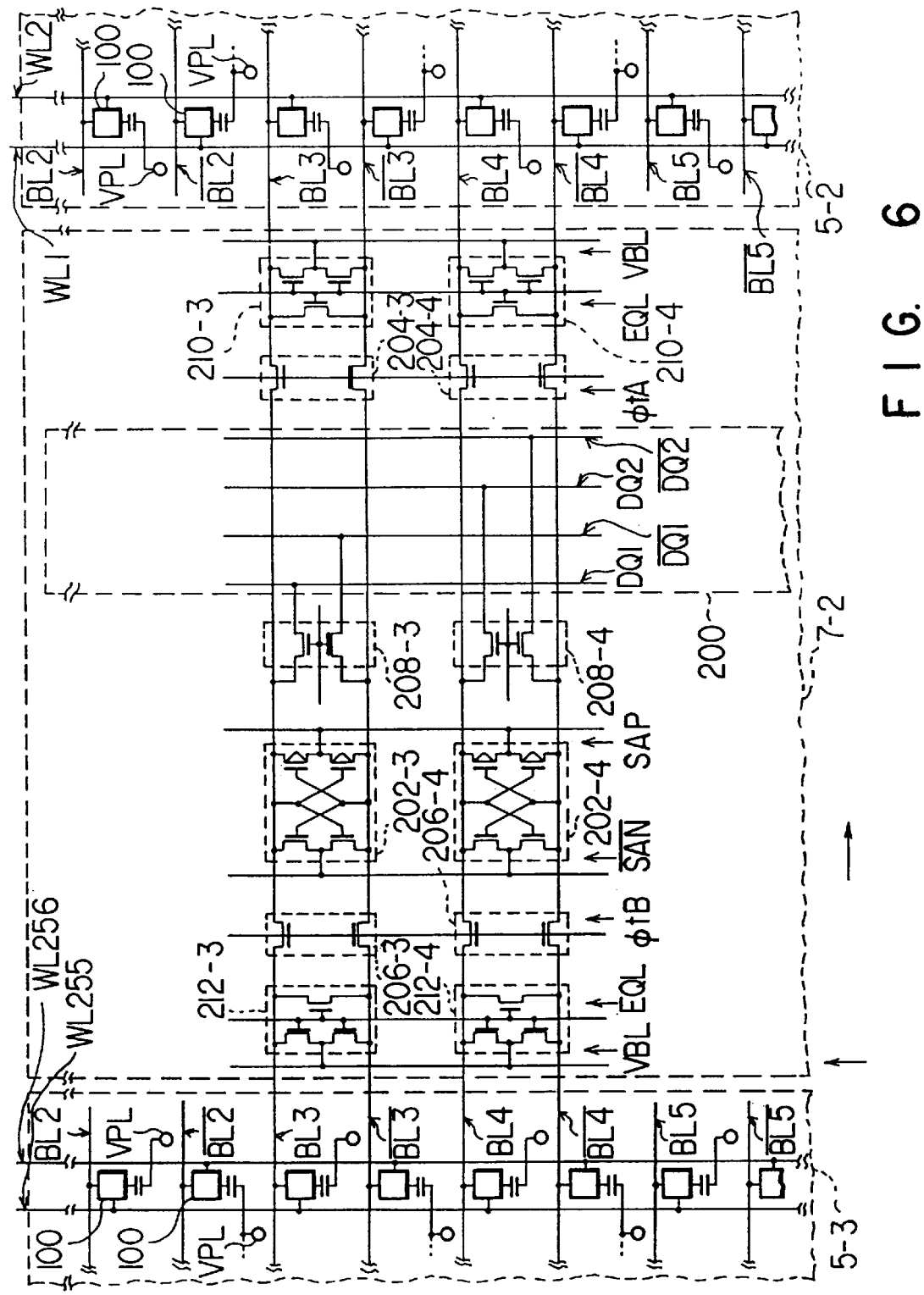
FIG. 6 is a circuit diagram of the sense amplifier array shown in FIG. 1.

FIG. 6 is a circuit diagram of the sense amplifier array 7-2.

As shown in FIG. 6, the sense amplifier array 7-2 is a shared sense amplifier type similarly to the sense amplifier array 7-1 shown in FIG. 4. Because the sense amplifier group and the DQ-line group are shared with the third memory cell array 5-3. The third memory cell array 5-3 is placed adjacent to the sense amplifier array 7-3.

The sense amplifier activation signal BSAN and SAP supplied to the sense amplifier 202 of the sense amplifier array 7-2 are respectively output from the N-channel type sense amplifier driving circuit formed in the block 19-2 and the P-channel type sense amplifier driving circuit formed in the block 21-2 shown in FIG. 1. Similarly, the column select signal CSL3 supplied to the column gate 208-3 of the sense amplifier array 7-2 is the same as the column select signal CSL3 supplied to the column gate 208-3 of the sense amplifier array 7-2. Similarly, the column select signal CSL4 supplied to the column gate 208-4 of the sense amplifier array 7-2 is the same as the column select signal CSL4 supplied to the column gate 208-4 of the sense amplifier array 7-0.

The first row decoder array 9-1 is placed adjacent to the side 27 of the memory cell array 5-1 except the sides of the memory cell array 5-1 adjacent to the sense amplifier array 7-1 and the sense amplifier array 7-0. The row decoder array 9-1 contains the first row decoder group for selecting the row of the BPT cell group integrated in the memory cell array 5-1.

The second row decoder array 9-2 is placed adjacent to the side 29 of the memory cell array 5-2 except the sides of the memory cell array 5-2 adjacent to the sense amplifier array 7-1 and the sense amplifier array 7-2. The row decoder array 9-2 contains the first row decoder group for selecting the row of the BPT cell group integrated in the memory cell array 5-2. The circuit of the second row decoder array 9-2 is substantially similar to that of the first row decoder array 9-1.

The column decoder array 11-1 is placed adjacent to the side 31 of the sense amplifier array 7-0 opposed to the memory cell array 5-1. The column decoder array 11-1 of this embodiment is shared in the memory cell arrays 5-1, 5-2, 5-3, . . . . The column decoder array 11-1 contains the column decoders for selecting the columns of the BPT cell column groups integrated in the memory cell arrays 5-1, 5-2, 5-3, . . . .

The first plate potential server block 13-1 is placed adjacent to the side 33 of the memory cell array 5-1 opposed to the row decoder array 9-1. The server block 13-1 is connected to a plate potential supply-wiring 50-1 supplied with the plate potential VPL. The plate potential supply-wiring 50-1 is connected to a plate potential VPL generator 52 formed in the chip 1. The VPL generator 52 fundamentally generates the plate potential VPL from the external power source potential VCC supplied out of the chip 1. In this embodiment, to prevent the potential change in the chip, the internal VCC is generated from the external VCC by an internal VCC generator 54. The internal VCC generator 54 generates the internal VCC by limiting the potential of the external VCC. The power source potential having small potential change, i.e., the internal VCC is obtained by limiting the potential. The VPL generator 52 generates the plate potential VPL from the internal VCC. The plate potential supply-wiring 50-1 is a low resistance metal wiring formed above the chip. As the low resistance metal of the metal wiring, metal containing, for example, aluminum as a main ingredient is selected. The feeder block 13-1 includes a connection node for connecting the buried plate-wiring to the plate potential supply-wiring. Therefore, the feeder block 13-1 contains the feeder for feeding the plate potential VPL to the buried plate-wiring 102 shown in FIG. 3 from the plate potential supply-wiring 50-1.

The second plate potential feeder block 13-2 is placed adjacent to the side 35 of the memory cell array 5-2 opposed to the row decoder array 9-2. The feeder block 13-2 includes a connection node for connecting the buried plate-wiring to the plate potential wiring. The feeder block 13-2 has the same configuration as the feeder block 13-1.

Figure 7:
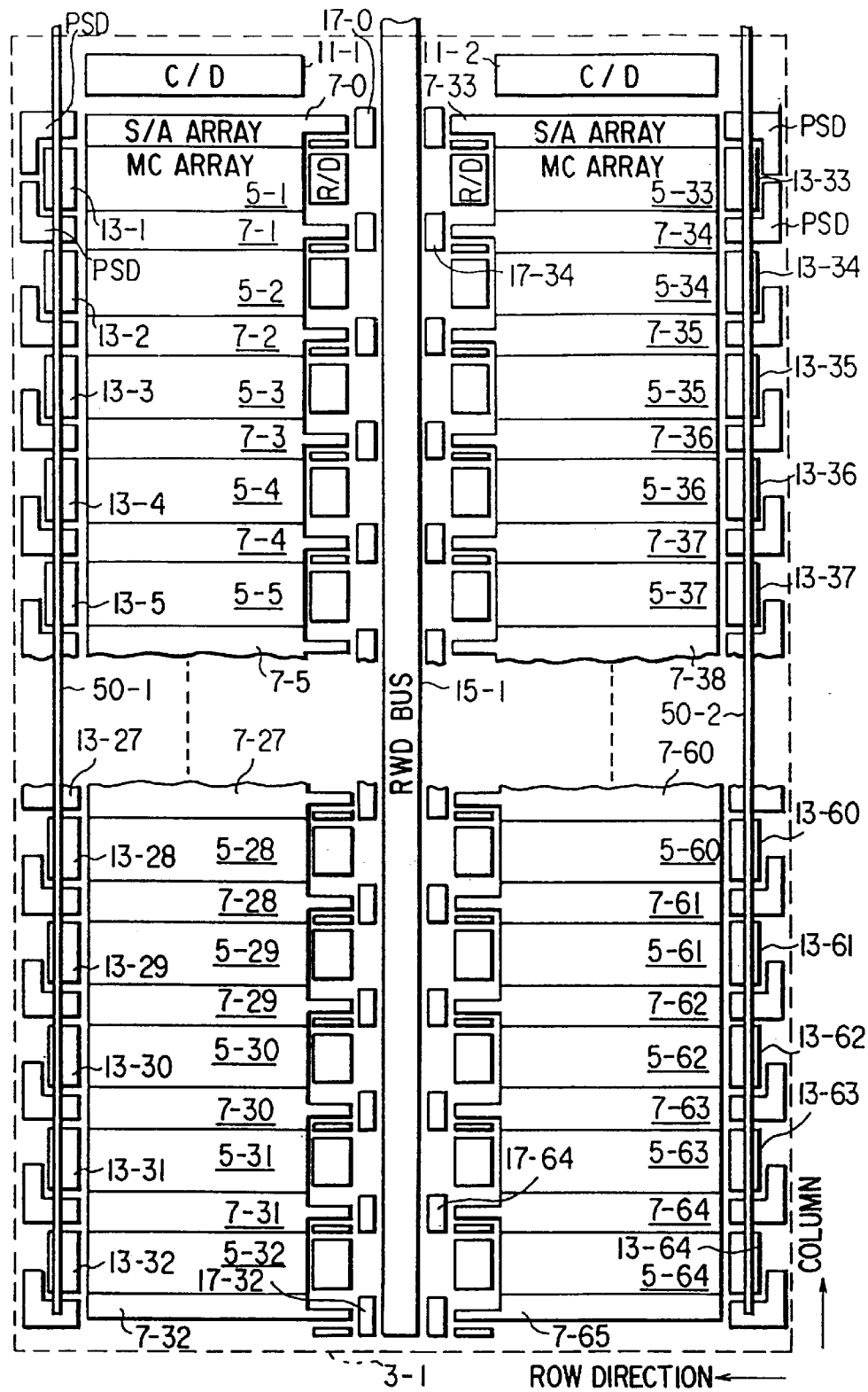
FIG. 7 is a block diagram showing the entire memory core shown in FIG. 1.
Figure 8:
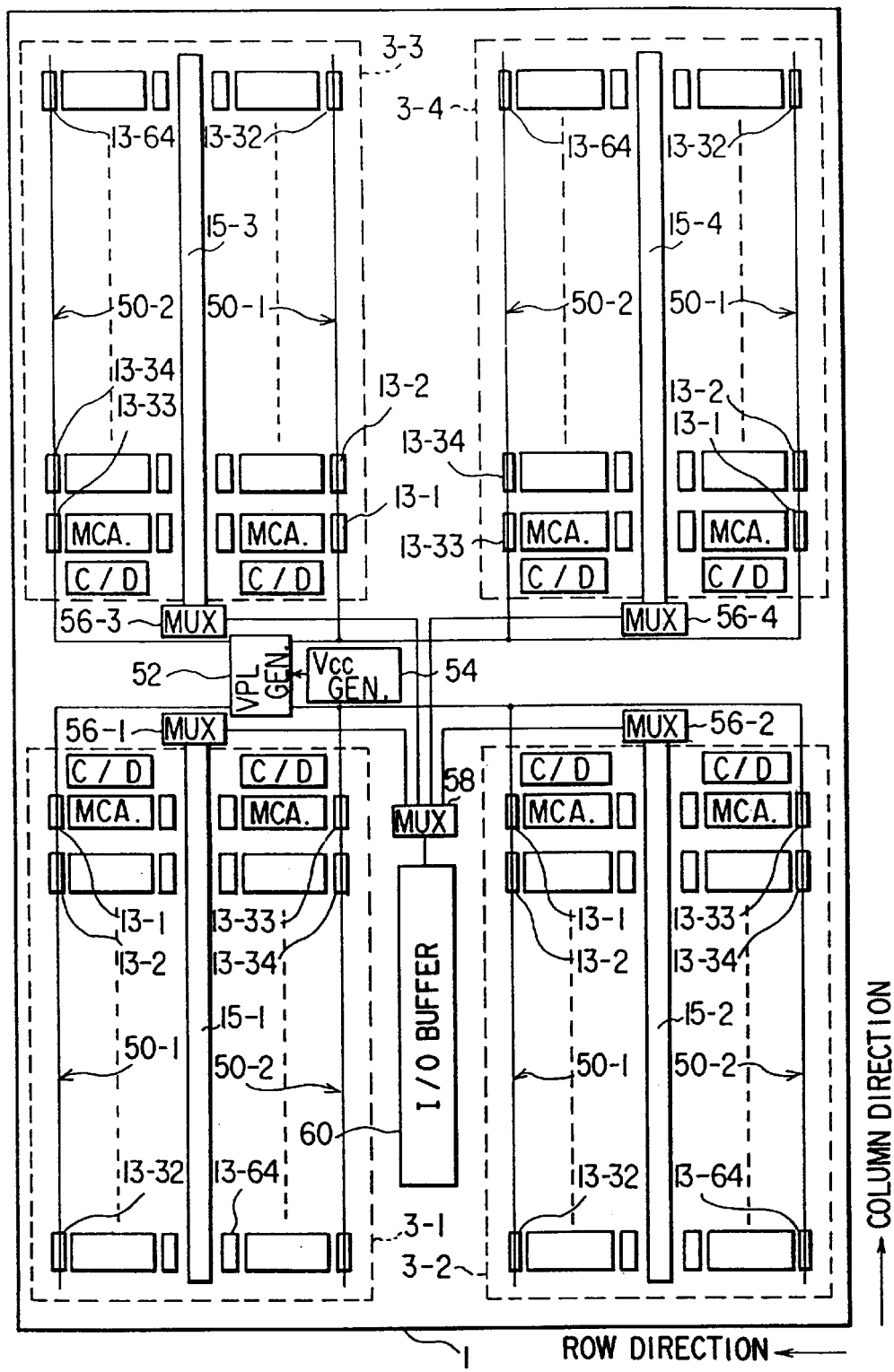
FIG. 8 is a block diagram showing the entire dynamic RAM according to the first embodiment of the present invention.

FIG. 7 is a block diagram showing the entire memory core 3-1 shown in FIG. 1, and FIG. 8 is a block diagram showing the entire dynamic RAM according to the first embodiment of the present invention.

The memory cell arrays 5-1, 5-2, 5-3, . . . , shown in FIG. 1 each has a memory capacity of 256 Kbit. In the memory core 3-1, 256 Kbit-memory cell arrays 5 (5-1 to 5-64) are integrated. Therefore, the memory capacity of the memory core 3-1 is 16 Mbit (256 Kbit×64).

As shown in FIG. 7, the read/write data (RWD)-line bus 15-1 is provided at the center line along the column direction of the memory core 3-1. The DQ-line pair group included in the sense amplifier array 7 is connected to the RWD-line pair group included in the RWD bus 15-1 through the DQ buffer 17. The DQ buffer 17 contains the sense amplifier for amplifying the potential difference between the DQ-line pair. The DQ buffer 17 amplifies the data signal transmitted to the DQ line pair and transmits it to the RWD-line pair.

The 64 memory cell arrays 5 are split to the 32 memory cell arrays 5, which are placed in the memory core 3-1. The split 64 memory cell arrays 5 are symmetrically placed at the memory cell array 5'WD-line bus 15-1 as a boundary. The server blocks 13 provided at the respective memory cell arrays 5 are placed in two rows along the edges of the memory core 3-1. The plate potential supply-wirings 50 are provided in the rows of the memory cell arrays which are split and placed. The two parallel plate potential supply-wirings 50 of this embodiment are provided along the edges of the memory core 3-1. The plate potential supply-wiring 50-1 is placed on the feeder block 13 placed in the row of the memory cell array of the left side of this paper, and the plate potential supply-wiring 50-2 is placed on the feeder block 13 placed in the row of the memory cell array of the right side of this paper. The plate VPL is transmitted to the buried plate-wiring 102 from the right and left edges of the memory core 3-1 toward the center of the memory core 3-1.

Further, as shown in FIG. 8, four memory cores 3 each having the above-described configuration are provided in one chip 1. The entire chip 1, i.e., the dynamic RAM according to the first embodiment has a memory capacity of 64 Mbit (16 Mbit×4).

The flow of the data signal when the data are read from the dynamic RAM shown in FIG. 8 is schematically as follows.

The data signals transmitted to the RWD-line bus 15-1 of the memory core 3-1 are multiplexed by a multiplexer 56-1. Similarly, the data signals transmitted to the RWD-line bus 16-2 of the memory core 3-2, the data signals transmitted to the RWD-line bus 15-3 of the memory core 3—3 and the data signals transmitted to the RWD-line bus 15-4 of the memory core 3-4 are respectively multiplexed by multiplexers 56-2, 56-3, 56-4. The data signals thus multiplexed are further multiplexed by a multiplexer 58. The data signals multiplexed by the multiplexer 58 are input to an input/output buffer 60. The data signals are output out of the chip 1 from the input/output buffer 60.

The flow of the data signals when the data are written in the dynamic RAM shown in FIG. 8 is substantially reverse to that when the data are read.

Then, the row decoder array, the memory cell array, the server block and the P-channel type sense amplifier driving circuit block will be explained in details.

Figure 9:
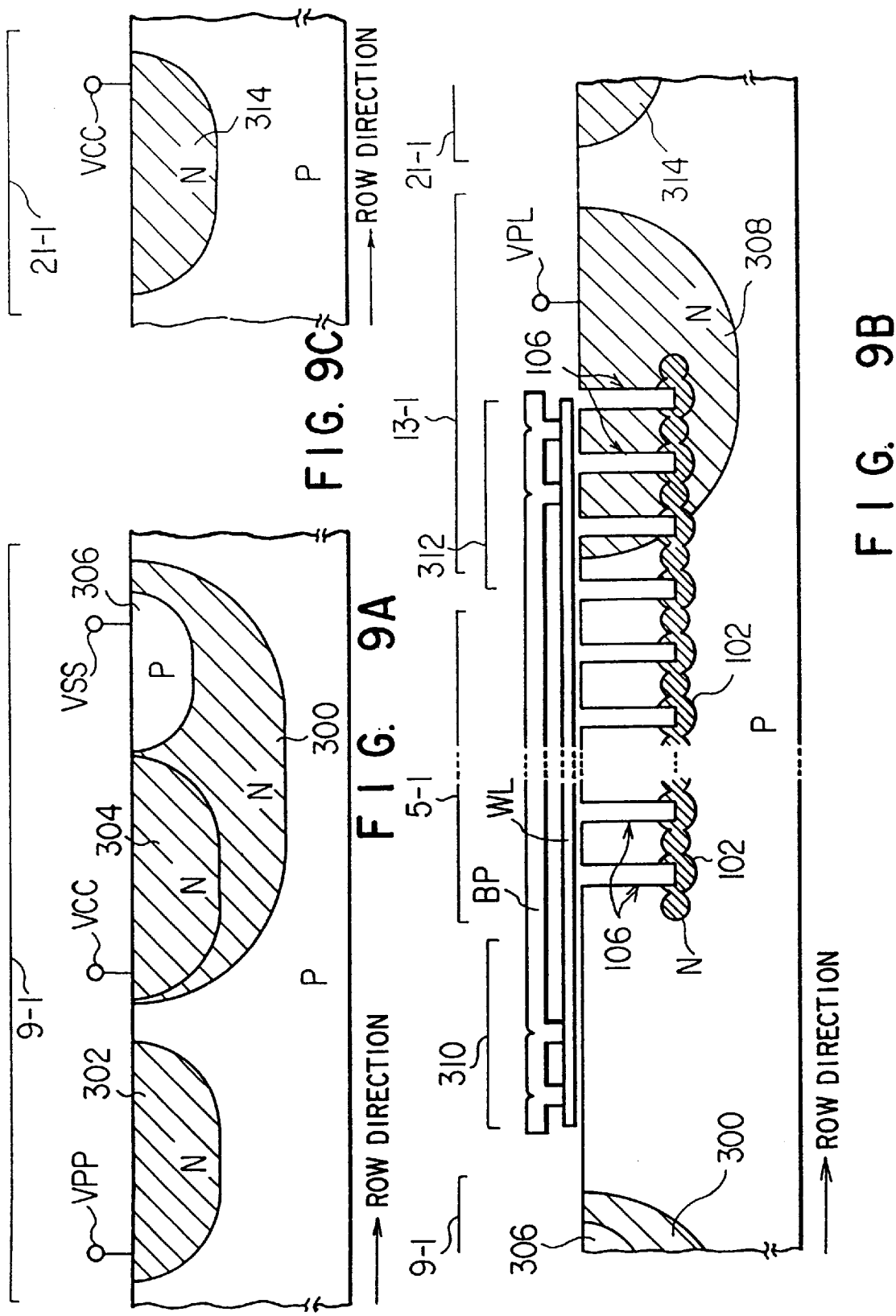
FIGS. 9A to 9C are sectional views taken along the lines 9—9 in FIG. 1.

FIGS. 9A and 9C are sectional views taken along the lines 9—9 shown in FIG. 1; FIG. 9A is a sectional view schematically showing the configuration of the row decoder array 9-1, FIG. 9B is a sectional view schematically showing the configuration of the memory cell array 5-1 and the feeder block 13-1, and FIG. 9C is a sectional view schematically showing the configuration of the P-channel type sense amplifier driving circuit block 21-1.

First, as shown in FIG. 9A, a deep N-type well 300 and a shallow N-type well 302 are formed in the region of the P-type substrate corresponding to the row decoder array 9-1. An N-type well 304 and a P-type well 306 are formed in the deep N-type well 300.

The power source potential VCC is applied to the deep N-type well 300 and the N-type well 304. The power source potential VCC is either the external power source potential VCC or the internal power source potential VCC. The power source potential VSS is applied to the P-type well 306. The power source potential VSS is a low potential power source, and is, for example, a ground potential.

A boosted potential VPP is applied to the shallow N-type well 302. The boosted potential VPP is the potential boosted up by a booster (not shown) from the external power source potential VCC or the internal power source potential VCC.

A P-channel type MOSFET group (not shown) is formed in the N-type well 304. The P-channel type MOSFET group (not shown) is used for the circuit of the power source potential system included in the row decoder array. An N-channel type MOSFET group (not shown) is formed in the P-type well 306. The N-channel type MOSFET group (not shown) is used for the circuit of the power source potential system included in the row decoder array. The circuit of the power source potential system included in the row decoder array contains a logic gate circuit group. The logic gate circuit group selects one word-line from the combination of a plurality of row addresses. When the row decoding system is a partial decoding type, the logic gate circuit group selects the word-line group containing, for example, $2^n$ word lines from the combination of a plurality of the row addresses. Specifically, the logic gate circuit group is a row decoder group. As the logic gate circuit group, a NAND gate circuit is normally used.

A P-channel type MOSFET group (not shown) is formed in the shallow N-type well 302. The P-channel type MOSFET group (not shown) is used for the circuit of the boosted potential system included in the row decoder array. The circuit of the boosted potential system included in the row decoder array contains a word-line driver. When the row decoding system is the partial decoding type, the row decoder array contains a word-line driver and a partial decoder. The word-line driver supplies the boosted potential VPP from the boosted potential power source to the word-line selected, for example, by the above-described logic gate circuit group or the word-line group. The partial decoder is the circuit similar to the above-described logic gate circuit (row decoder) group, and selects the row of the one word-line driver from the combination of the plurality of the row addresses. The partial decoder supplies the boosted potential VPP as the boosted potential power source to the row of the selected word-line driver. When the above-described logic gate circuit (row decoder) group is included in the step-up potential system, the P-channel type MOSFET group of the above-described logic circuit gate circuit (row decoder) group is formed in the shallow N-type well 302 instead of the N-type well 304.

As shown in FIG. 9B, the memory group containing the trench group 106 and the buried plate-wiring 102 contacted with the bottom of the trench group 106 is formed in the region responsive to the memory cell array 5-1 of the P-type substrate 1. The trench group 106, the buried plate-wiring 102 contacted with the bottom of the trench group 106 and the deep N-type well 308 are formed in the region responsive to the server block 13-1 of the P-type substrate 1.

The plate potential supply-wiring 50 (not shown) is connected to the deep N-type well 308, and the plate 10 potential VPL shown in FIG. 1 is applied. The deep N-type well 308 is connected to the buried plate-wiring 102. Thus, the deep N-type well 308 becomes the feeder for feeding the plate potential VPL to the buried plate supply-wiring 102. The deep N-type well 308 is formed by implanting N-type impurity such as, for example, phosphorus (P) or arsenic (As) in the substrate and then thermally diffusing the implanted impurity in the substrate 1. The depth of the deep N-type well 308 is varied according to the designed plane 20 region of the well 308, the heat history (the grand total time of the heat treating time) or the depth of the buried plate-wiring 102 of the BPT cell group. In this embodiment, the depth of the deep N-type well 308 is about 8 $\mu$m. Because the depth of the buried plate-wiring 102 is about 5 $\mu$m. The depth of the deep N-type well 308 is formed to be deeper than that of the buried plate-wiring 102, and hence the N-type well 308 is always contacted with the buried plate-wiring 102. The depth of the buried plate-wiring 102 is altered according to the capacitance of the BPT cell. In this embodiment, even if the BPT cell is miniaturized, the depth of the trench 106 is so formed about 5 $\mu$m as to obtain sufficient capacitance.

Further, as shown in FIG. 9B, tap regions 310 and 312 are respectively provided at both ends of the word-line WL. The tap regions 310 and 312 are respectively connecting regions for connecting bypass word-lines BP to the word-lines WL shown in FIG. 3. The tap region 312 of the server block 13-1 side is overlapped on the deep N-type well 308. The tap regions 310 and 312 are needed in the dynamic RAM having the bypass word-line BP. Therefore, the area of the chip is increased by the tap regions 310 and 312 in the row direction. In this embodiment, the tap region 312 is overlapped on the deep N-type well 308, thereby suppressing the area increased in the row direction.

As shown in FIG. 9C, the shallow N-type well 314 is provided in the region of the P-type substrate 1 in response to the P-channel type sense amplifier driving circuit block 21-1.

The power source potential VCC is applied to the shallow N-type well 314. The power source potential VCC is either the external power source potential VCC or the internal power source potential VCC.

The P-channel type MOSFET group (not shown) is formed in the shallow N-type well 314. The P-channel type MOSFET group (not shown) is used for the circuit of the power source potential system included in the P-channel type sense amplifier driving circuit. The circuit of the power source potential system included in the P-channel type sense amplifier driving circuit is a sense amplifier activation signal-line driver. The sense amplifier activation signal-line driver outputs, for example, the activation signal SAP of the VCC level to the sense amplifier activation signal-line in response to the driving circuit activation signal line.

Subsequently, the memory cell array and the feeder block will be further explained in detail.

Figure 10:
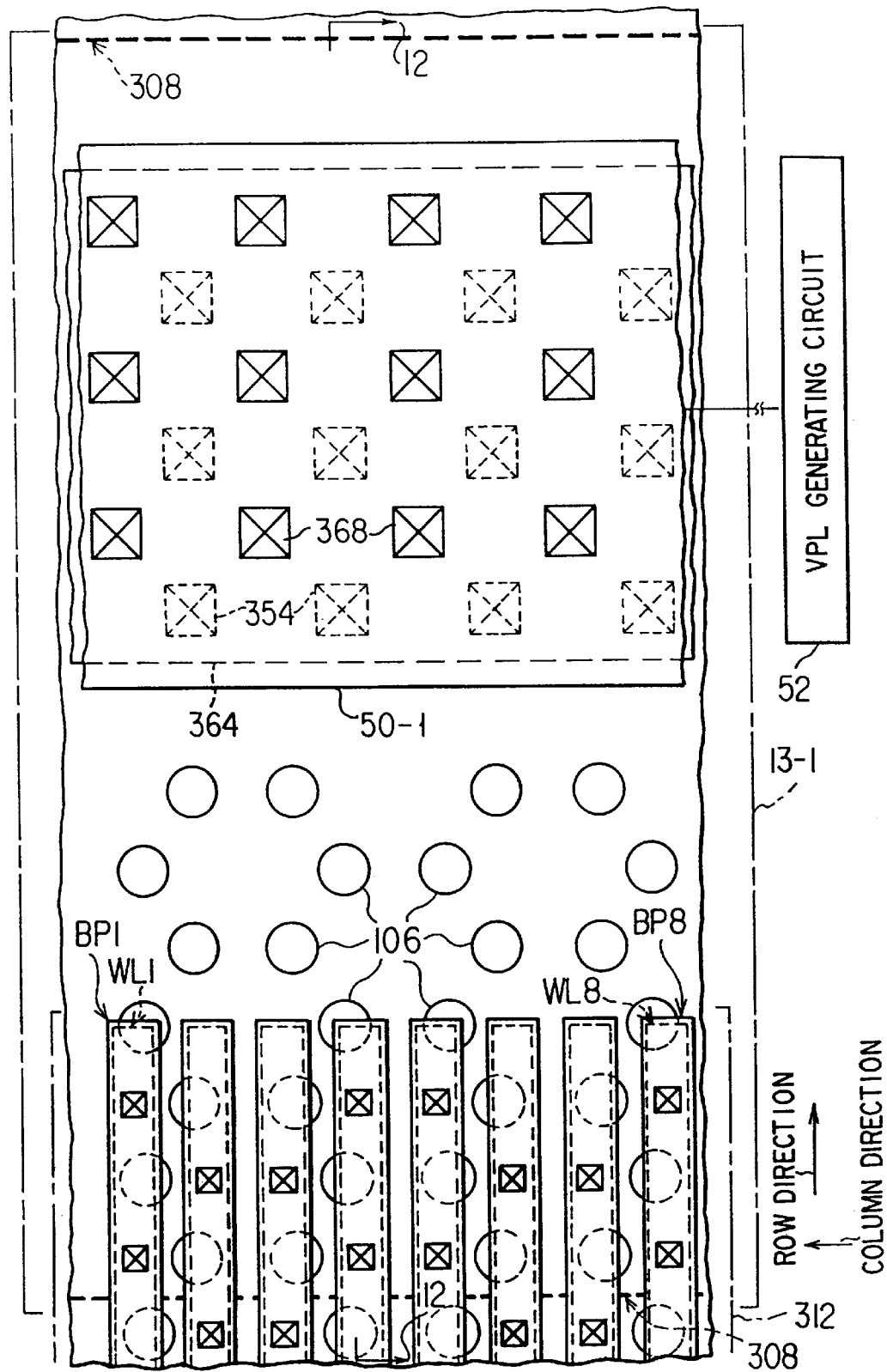
FIG. 10 is a plan view showing the portion of the plate potential feeder block.
Figure 11:
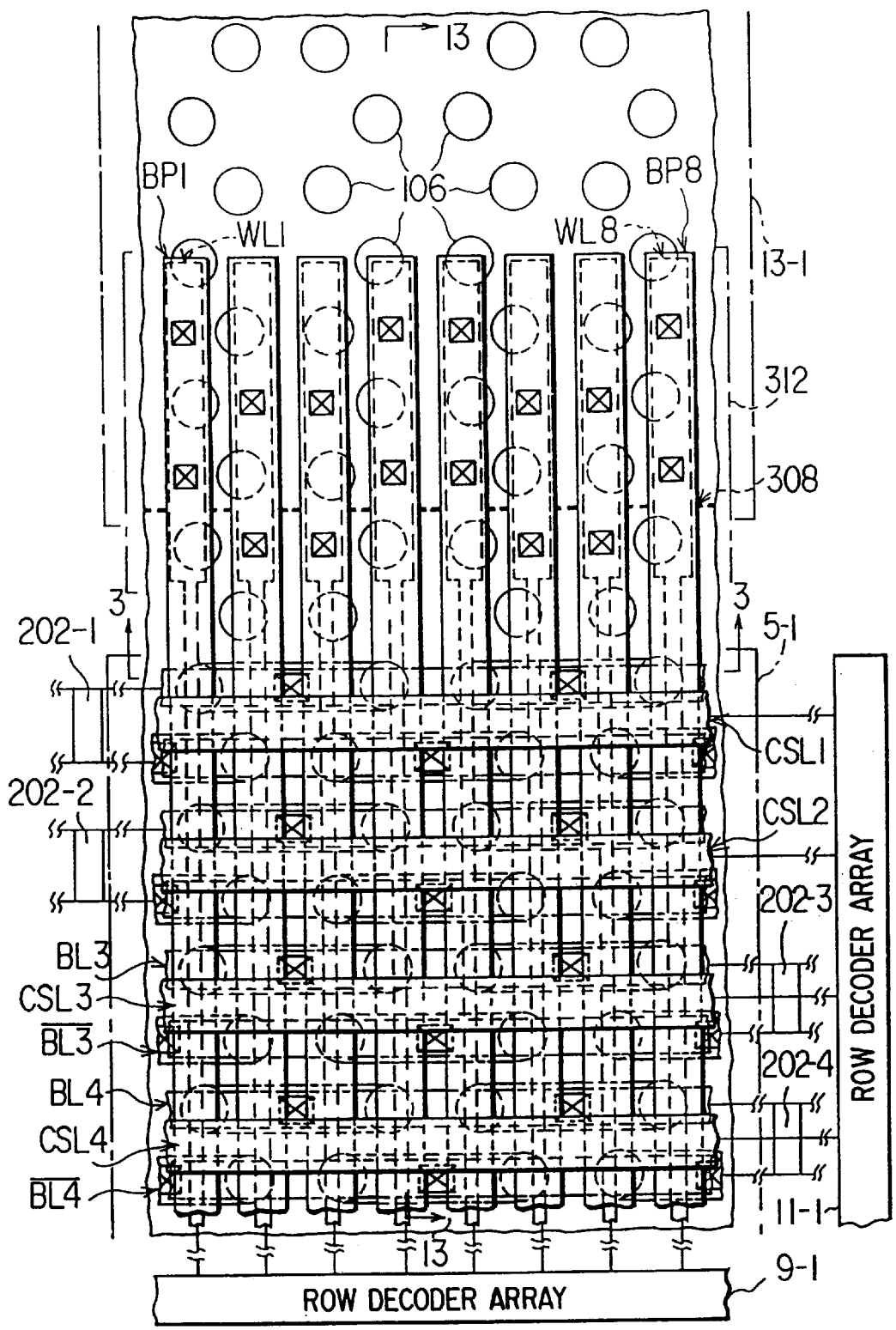
FIG. 11 is a plan view showing the portion of the memory cell array.
Figure 12:
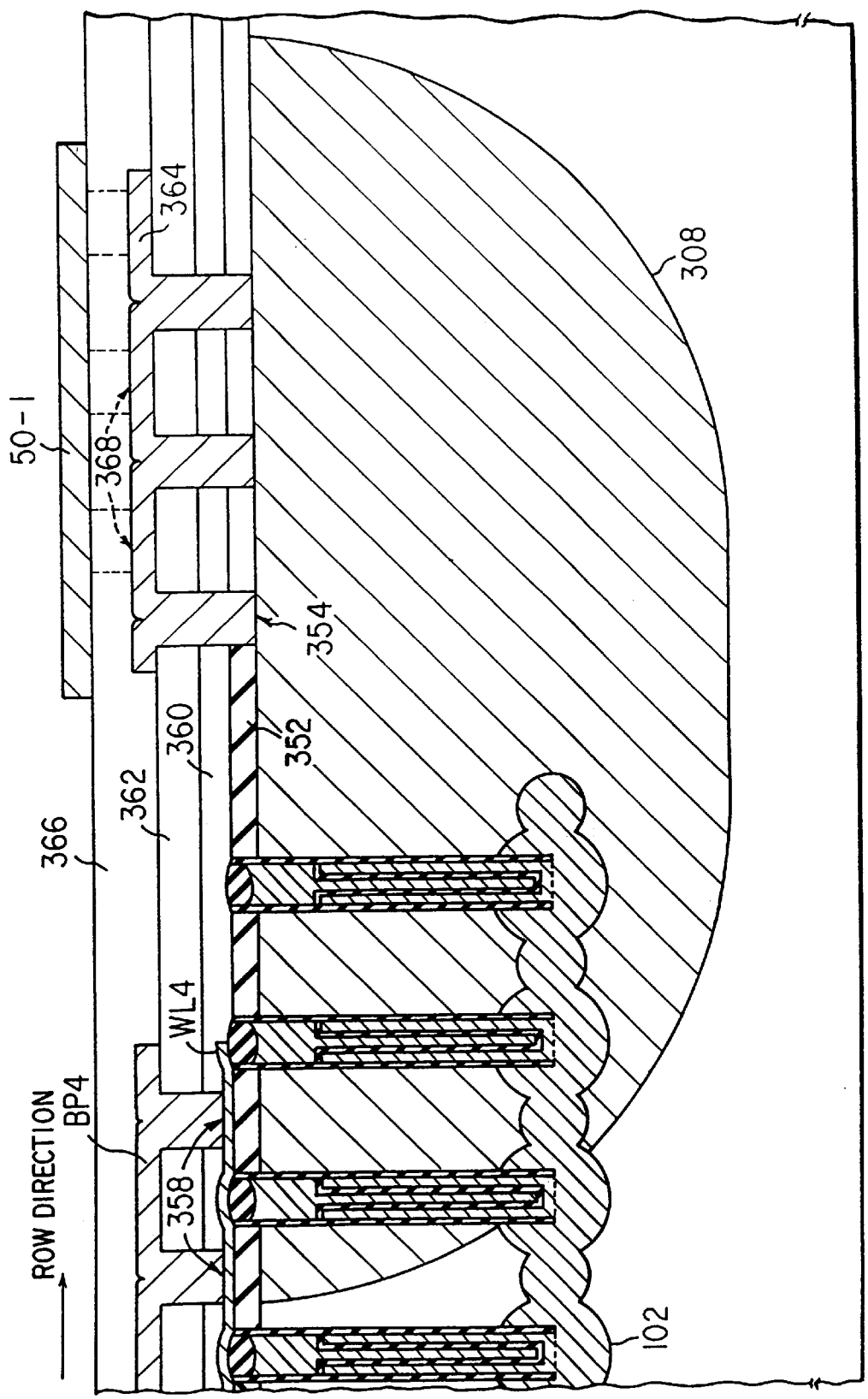
FIG. 12 is a sectional view taken along the lines 12—12 in FIG. 10.
Figure 13:
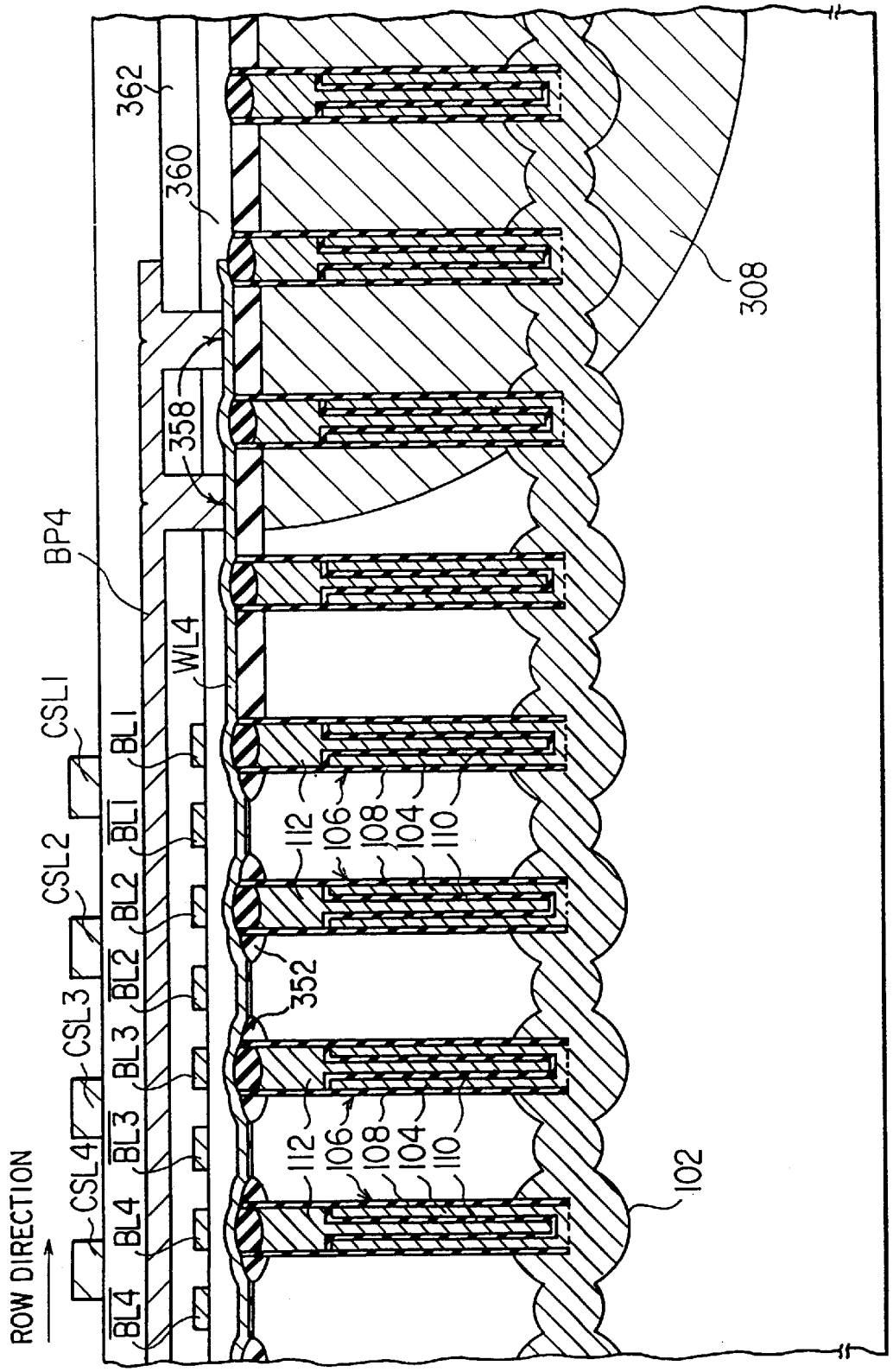
FIG. 13 is a sectional view taken along the lines 13—13 in FIG. 11.

FIG. 10 is a plan view showing the portion of the feeder block, FIG. 11 is a plan view showing the portion of the memory cell array, FIG. 12 is a sectional view taken along the lines 12—12 in FIG. 10, and FIG. 13 is a sectional view taken along the lines 13—13 in FIG. 10.

Figure 14:
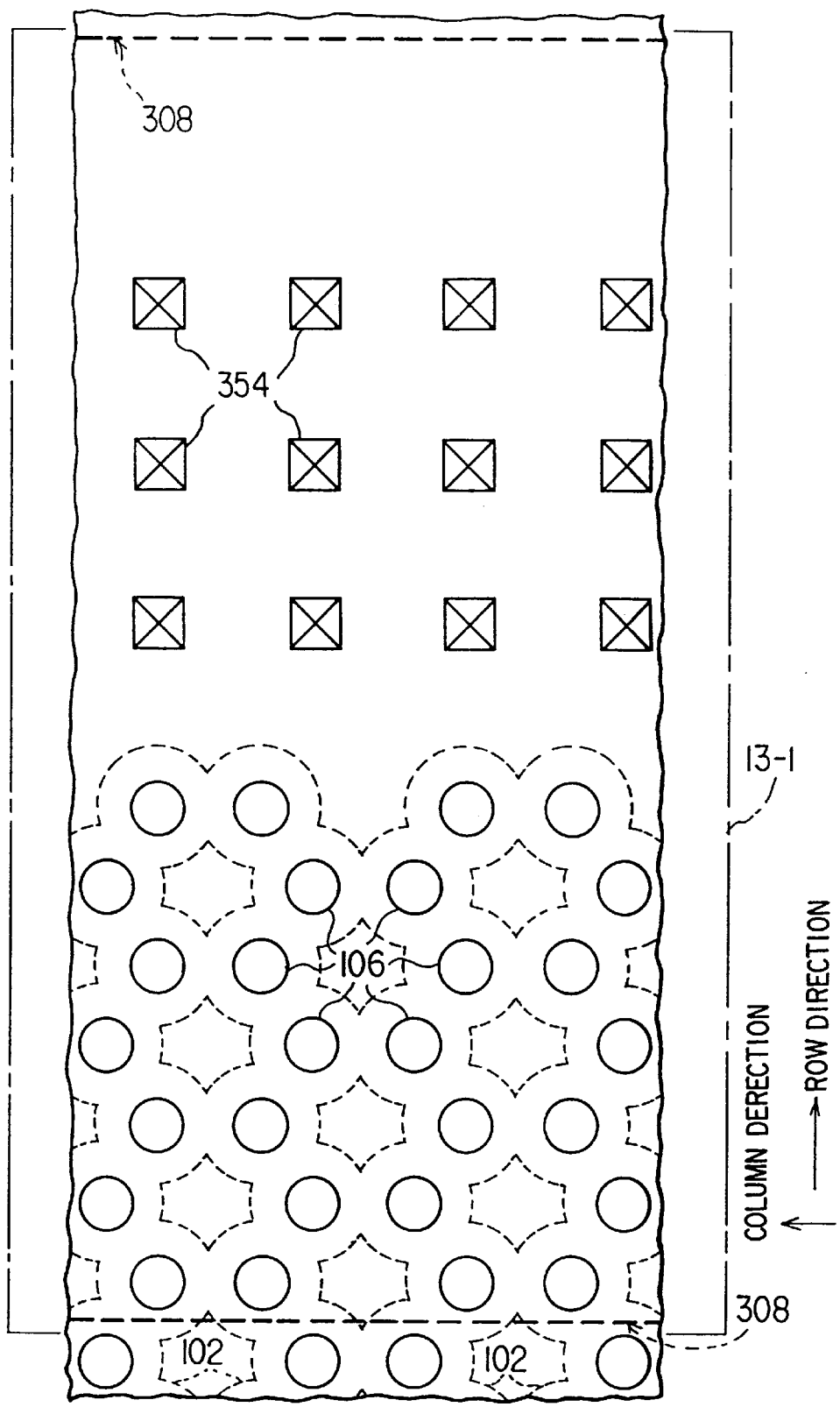
FIG. 14 is a plan view showing up to the substrate surface of the plate potential feeder block shown in FIG. 10.
Figure 15:
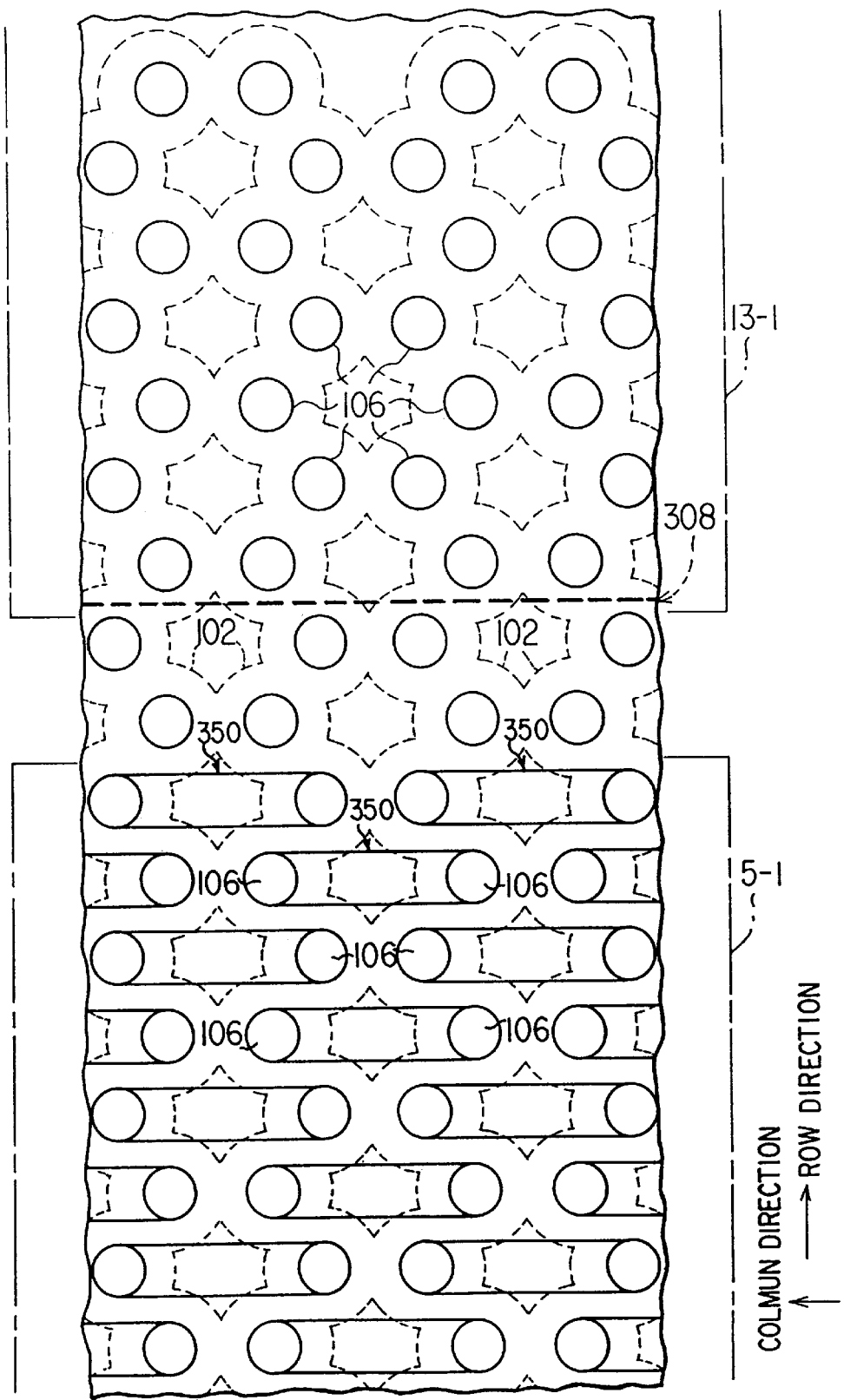
FIG. 15 is a plan view showing up to the substrate surface of the memory cell array shown in FIG. 11.
Figure 17:
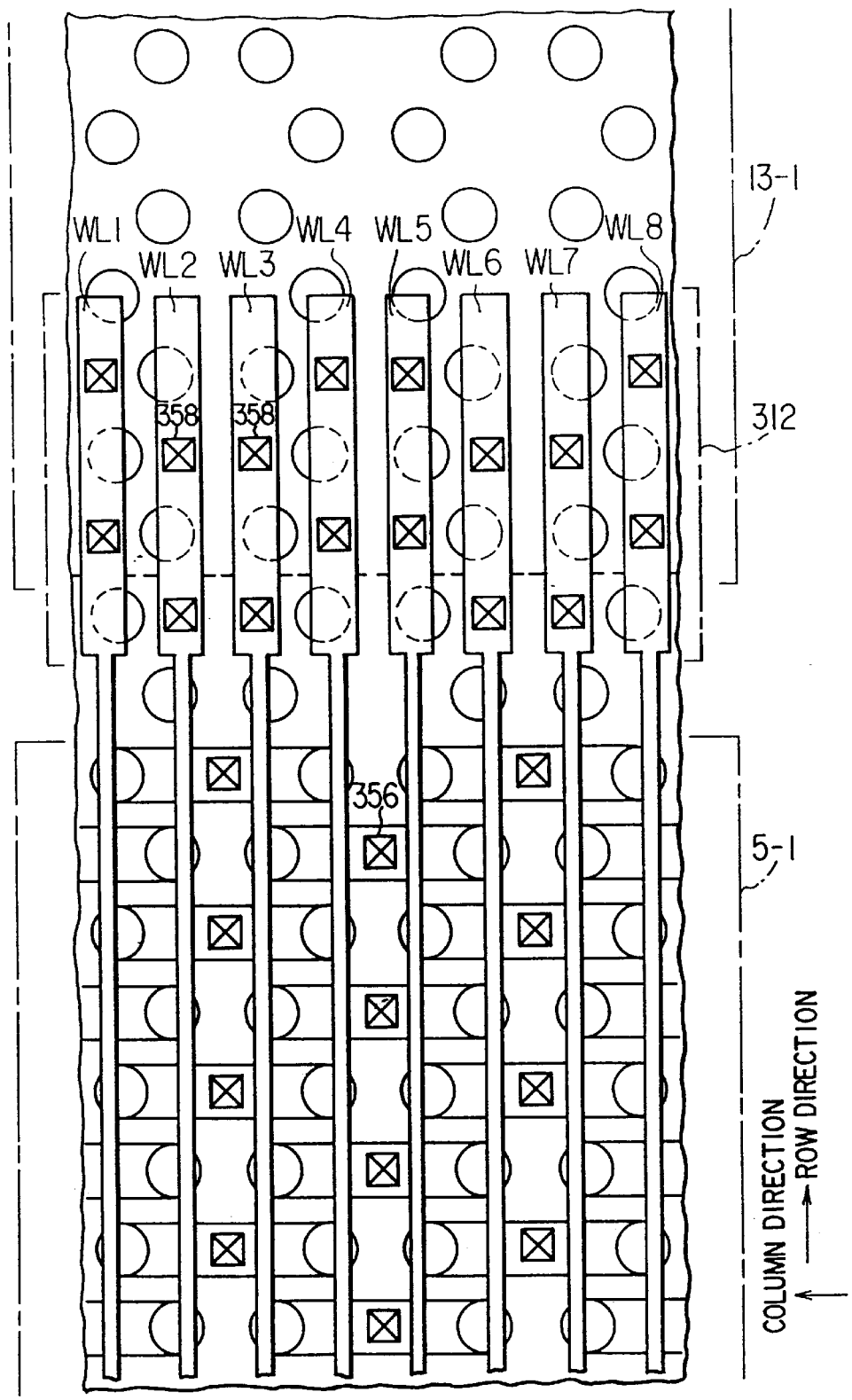
FIG. 17 is a plan view showing up to the first polysilicon layer of the memory cell array shown in FIG. 11.
Figure 18:
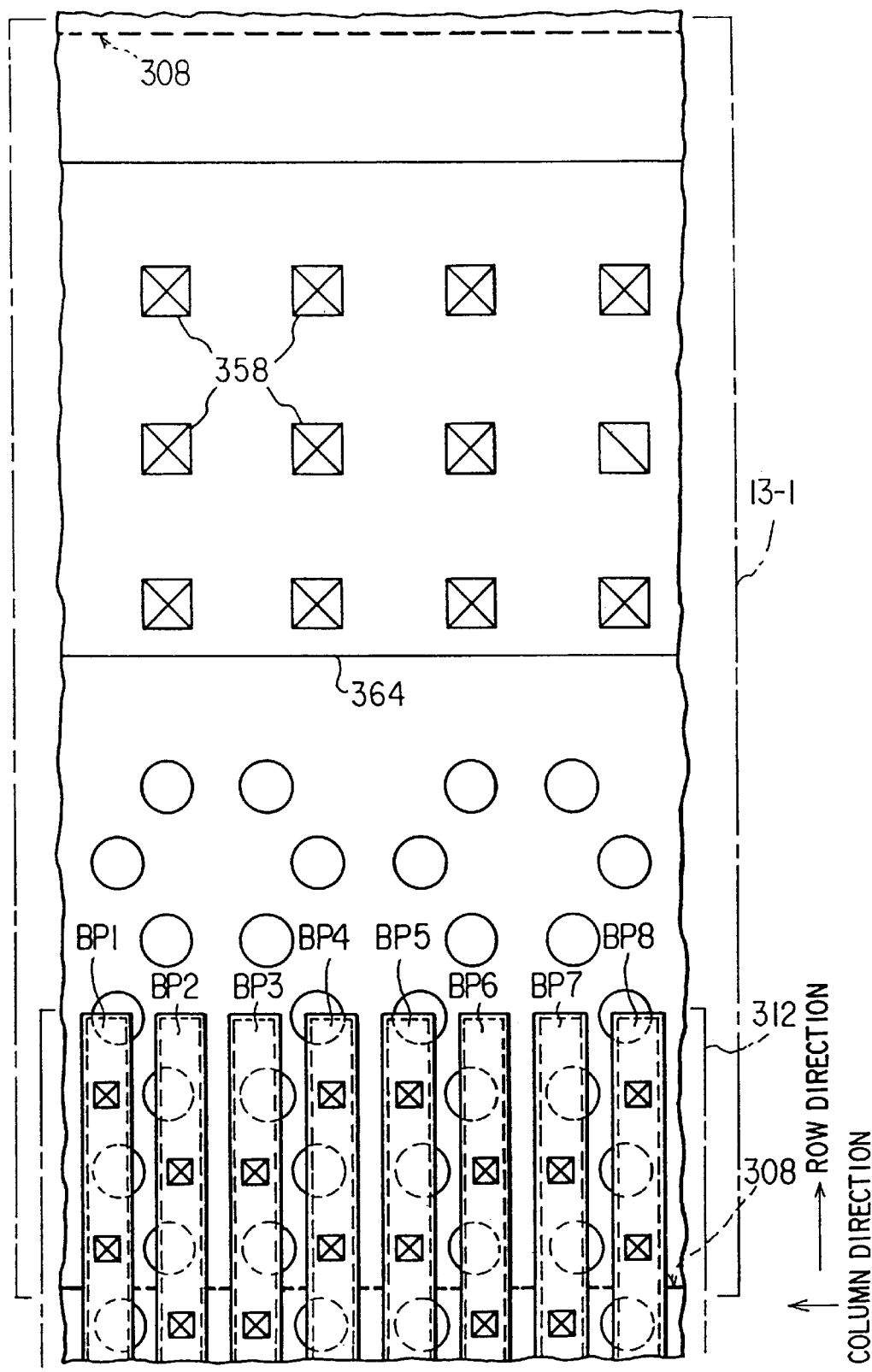
FIG. 18 is a plan view showing up to the first aluminum layer of the plate potential feeder block shown in FIG. 10.
Figure 19:
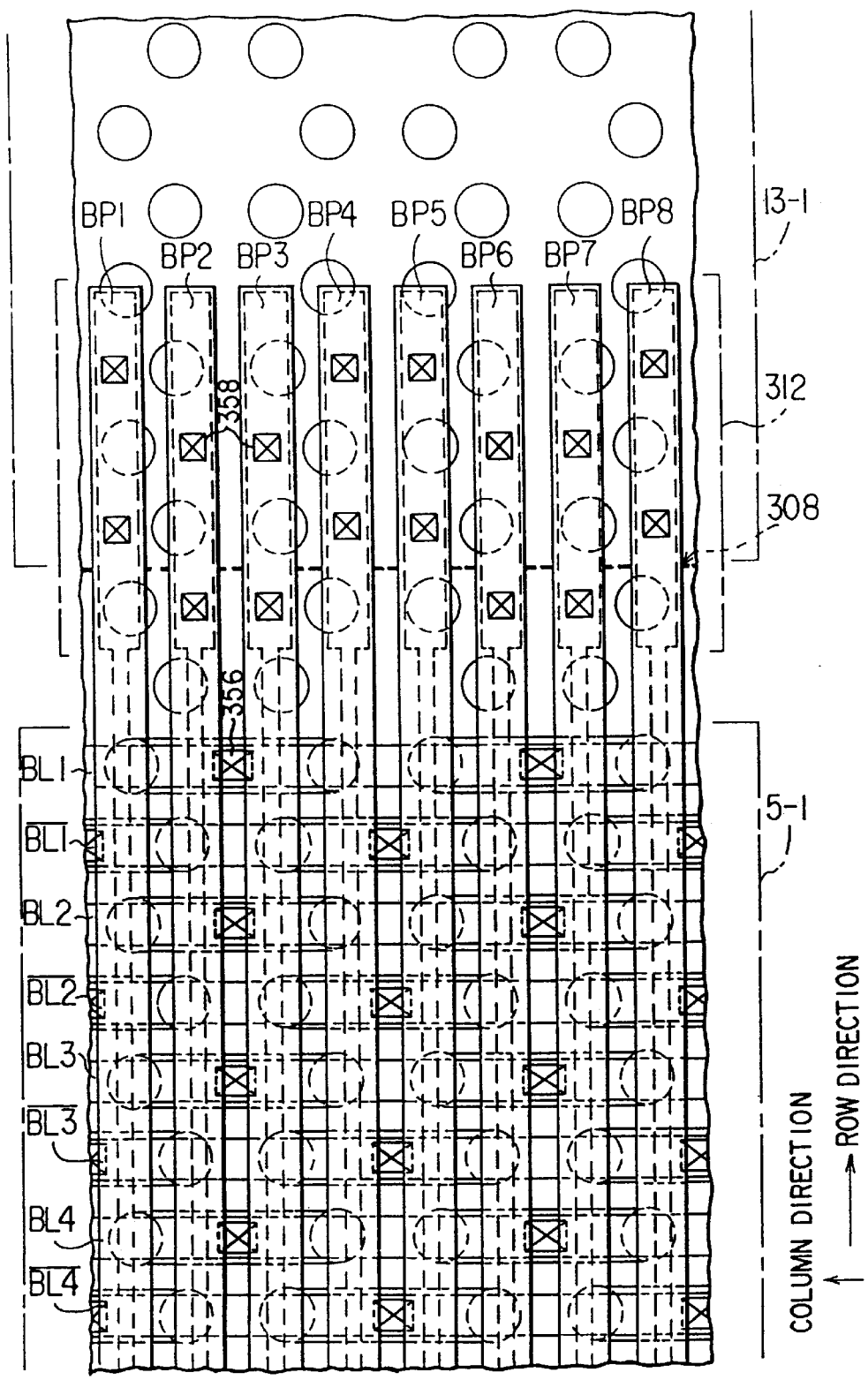
FIG. 19 is a plan view showing up to the first aluminum layer of the memory cell array shown in FIG. 11.

FIG. 14 is a plan view showing up to the substrate surface of the plan view shown in FIG. 10, FIG. 15 is a plan view showing up to the substrate surface of the plan view shown in FIG. 11, FIG. 16 is a plan view showing up to the first polysilicon layer of the plan view shown in FIG. 10, FIG. 17 is a plan view showing up to the first polysilicon layer of the plan view shown in FIG. 11, FIG. 18 is a plan view showing up to the first aluminum layer of the plan view shown in FIG. 10, and FIG. 19 is a plan view showing up to the first aluminum layer of the plan view shown in FIG. 11.

As shown in FIGS. 10 to 19, element regions 350 exposed on the surface of the substrate 1 are formed in a matrix state on the memory cell array 5-1. The plane shape of the element region 350 is a rectangular shape having a long side in the column direction. The element regions 350 are displaced by ½ pitch at each column. Trenches 106 are respectively formed at both ends of the element region 350 (particularly in FIG. 15). The surface of the substrate 1 except the element regions 350 is covered with a field oxide film (SiO$_2$) 352 (particularly in FIGS. 12 and 13). N-type impurity (phosphorus or arsenic) is diffused in the substrate 1 from the bottom of each trench 106. The N-type impurity is diffused in a spherical state at the bottom of the trench 106 as a center. The N-type impurities diffused in the spherical states are contacted with each other in the substrate 1. The N-type buried plate-wiring 102 is obtained by contacting the N-type impurities diffused in the spherical states with each other. The region of about half of the N-type well 308 is overlapped on the N-type buried plate-wiring 102 as seen in plane (particularly in FIG. 14). The plate potential supply-wiring 50-1 is contacted with the region of the other half of the N-type well 308. In FIG. 14, the region indicated by reference numeral 354 is its contact region.

The word-line WL is formed along the row direction on the substrate 1 by using the first polysilicon layer (particularly in FIG. 17). The two word-lines WL respectively cross the one element region 350. The bit-line BL is contacted with the region sandwiched by the two word-lines of the element region 350. In FIG. 17, the region indicated by reference numeral 356 is its contact region. The portion of the word-line WL on the server block 13-1 has a wider width than the portion on the memory cell array 502 (particularly in FIG. 16). The region in which the width of the word-line is wide is the tap region 312. The bypass word-line BP is contacted with the tap region 312. In FIG. 16, the region indicated by reference numeral 358 is its contact region.

A first interlayer insulating film 360 is formed on the first polysilicon layer, and the word-lines WL are connected to each other (particularly in FIGS. 12 and 13). The bit-line BL (/BL) is formed along the column direction on the first interlayer insulating film 360 by using the laminated film (polycide film) of the second polysilicon layer and the metal silicide layer (particularly in FIG. 19). One bit-lines are respectively connected to the one element regions 350 through the contact region 356.

A second interlayer insulating film 362 is formed on the polycide film, and the bit-lines BL (/BL) are connected to each other (particularly in FIGS. 12 and 13). The bypass word-line BP is formed along the row direction on the second interlayer insulating film 362 by using the first aluminum layer (particularly in FIG. 19). The one bypass word-lines BP are respectively connected to the one wordlies WL through the contact region 358.

Further, in this embodiment, an intermediate wiring 364 is formed on the other half region of the above-described N-type well 308 by using the above-described first aluminum layer (particularly in FIG. 18). The intermediate wiring 364 is connected to the N-type well 308 through the contact region 356. The intermediate wiring 364 suppresses the deepening of the contact hole.

A third interlayer insulating film 366 is formed on the first aluminum layer, and the bypass word-lines BP are insulated from each other, and further the intermediate wiring layers 364 are insulated from each other (particularly in FIGS. 12 and 13). The column select line CSL is formed along the column direction on the third interlayer insulating film 366 by using the second aluminum layer (particularly in FIG. 11). The column select lines CSL are respectively formed on the bit-lines BL and /BL. The column select lines CSL are not contacted on the memory cell 5-1, and contacted with the gate of the N-channel type MOSFET of the column gate 208 on the sense amplifier array 7.

Further, in this embodiment, the plate potential supply-wiring 50-1 is formed on the intermediate wiring 364 by using the above-described second aluminum layer (particularly in FIG. 10). The plate potential supply-wiring 50-1 is connected to the intermediate wiring 364 through the contact region 368. The plate potential supply-wiring 50-1 supplies the plate potential VPL to the N-type well 308 through the intermediate wiring 364. The contact region 368 is displaced from the contact region 354, and so formed as not to be overlapped on the contact region 354. In this embodiment, the contact region 368 is formed on the flat portion of the intermediate wiring 364, thereby improving the probability of realizing the normal contact.

In the dynamic RAM according to the first embodiment, as shown in FIG. 1, the feeder block 13-1 is placed adjacent to the side 33 of the memory cell array 5-1 opposed to the row decoder array 9-1, and the feeder block 13-2 is placed adjacent to the side 35 of the memory cell array 502 opposed to the row decoder array 9-2. In this configuration, when the feeder blocks 13-1, 13-2 are provided as new blocks on the substrate (chip) 1, the integration of the column direction is not disturbed. However, in the dynamic RAM according to the first embodiment, the new block is added in the substrate (chip) 1, the area loss exists that much to be added.

In the dynamic RAM having the block placement shown particularly in FIGS. 1, 7 and 8, the area loss is decreased in the case that the integration density of the row direction is disturbed as compared with the case that the integration density of the column direction is disturbed. Because, when the feeding block 13 is placed between the memory cell array 5 and the sense amplifier array 7, 32 feeding blocks 13 are added along the column direction in the memory core 3 shown in FIG. 7. Further, when the plurality of the memory cores 3 are placed on the substrate (chip) 1, if the memory core 3 is placed, for example, as shown in FIG. 8, 64 feeding blocks 13 are added along the column direction. Therefore, it is largely extended along the column direction.

Contrary, when the feeder blocks 13 are placed at the sides 33 and 35 of the memory cell array 5 opposed to the row decoder array 9 like in the dynamic RAM according to the first embodiment, only the two feeder blocks 13 may be added along the row direction in the memory core 3 shown in FIG. 7. Further, when the plurality of the memory cores 3 are placed on the substrate (chip) 1, even when the memory cores 3 are placed, for example, as shown in FIG. 8, only four server blocks 13 may be added along the row direction. From such viewpoint, in the dynamic RAM according to the first embodiment described above, the chip 1 is not extended along the column direction, but may be extended to the minimum limit along the row direction. Therefore, the dynamic RAM has the connection node for connecting the buried plate-wiring to the plate potential supply-wiring which does not disturb the integration density of the entire chip.

Further, in the dynamic RAM according to the first embodiment described above, the following effects are obtained in addition to the above effect.

FIG. 20 is a block diagram showing in detail the block shown in FIG. 1.

As shown in FIG. 20, in the dynamic RAM according to the first embodiment described above, the feeder blocks 13 are placed at the sides 33 and 35 of the memory cell array 5 opposed to the row decoder array 9, and the RWD bus 15 is placed at the row decoder array 9 side. From this configuration, even if the feeder blocks 13 are added to the chip, the accelerations of reading and writing the data are not disturbed. For instance, when the feeder block 13 is placed, for example, between the row decoder array 9 and the memory cell array 5, the length of the word-line WL is extended merely by placing the feeder block 13. When the length of the word-line WL is extended, the time necessary to select the memory cell is lengthened. When the RWD bus 15 is provided at the feeder block 13 side, the plate potential supply-wiring 50-1 and the RWD bus 15 are placed adjacent in parallel with each other. The potential of the plate potential supply-wiring 50-1 is fixed to the plate potential VPL. Therefore, there might couple the plate potential supply-wiring 50-1 to the RWD bus 15, and hence the time for generating a predetermined potential difference between the RWD-line pair is lengthened. Since the other circuit block is not placed between the row decoder array 9 and the memory cell array 5, the length of the data-line DQ is not increased. The predetermined potential difference is data to be read from the memory cell or the data to be written in the memory cell.

Therefore, in the dynamic RAM according to the first embodiment described above, the feeder blocks 13 are placed at the sides 33 and 35 of the memory cell array 5 opposed to the row decoder array 9. Accordingly, the length of the word-line is not increased. Further, since the RWD bus 15 is placed at the row decoder array 9 side, the memory cell array 5 and the like exist between the plate potential supply-wiring 50-1 and the RWD bus 15, and the plate potential supply-wiring 50-1 is not coupled to the RWD bus 15. The length of the data-line DQ is not increased as well. From such viewpoints, in the dynamic RAM according to the first embodiment, the accelerations of reading and writing the data are not disturbed.

As shown in FIG. 20, in the dynamic RAM according to the first embodiment, the wells 308 of the feeders are respectively provided at the feeder blocks 13, and the P-channel type sense amplifier driving circuits 21 are disposed between the wells 308. Thus, the area loss due to the addition of the feeder block 13 can be reduced more. The P-channel type sense amplifier driving circuit 21 contains the P-channel type MOSFET for driving the sense amplifier activation signal line SAP. The P-channel type MOSFET 21 supplies the potential VCC to the sense amplifier group, and has a large size. Because sufficient drivability is required for the P-channel type MOSFET. The circuit containing such P-channel type MOSFET is formed between the wells 308. Thus, the regions generated between the wells 308 are effectively used. From such standpoint, the invalid region (dead region) is deleted from the substrate (chip) 1, and the area loss due to the addition of the feeder block 13 is reduced more. In the embodiment, since the P-channel type sense amplifier driving circuits 21 cannot be sufficiently placed only between the wells 308, the P-channel type sense amplifier driving circuits 21 are placed in an "L" shape along the sides of the well 308 opposed to the memory cell array 5 from the side of the well 308 to the sense amplifier array 7-1 side. The area of the P-channel type sense amplifier driving circuit 21 is so large that they have to be placed in the "L" shape.

Further, in the dynamic RAM according to the first embodiment, as shown in FIG. 20, the wells 308 of the feeders are respectively provided at the feeder blocks 13, and the wells 308 are dispersed at the respective memory cell arrays 5. Thus, the variation of the plate potential VPL of the buried plate-wiring 102 can be suppressed.

Incidentally, in the dynamic RAM having a memory capacity of a large scale of 64 Mbit class or more, power consumption is large. Particularly, when the data is refreshed, the quantity of the data to be refreshed is huge, and the power consumption is increased. Therefore, to decrease the power consumption in the large-scale memory capacity dynamic RAM, there has been employed the system in which only the memory cell array in which the data are refreshed is set to the active state and the other memory cell arrays are set to a non-active state. In such a dynamic RAM, there is possibility that an electric noise is introduced from the memory cell array of the active state to the buried plate-wiring 102 of the memory cell array of the non-active state. Particularly, when the buried plate-wiring 102 is connected through the well region 308 in the substrate 1, the possibility is high. If the electric noise is introduced to the buried plate-wiring 102 and the plate potential VPL is varied. The data stored in the memory cell might be destroyed, or in the worst case, there is possibility that the capacitor dielectric film which is thinner and more delicate is damaged. At this point, in the dynamic RAM according to the first embodiment in which the wells 308 are respectively provided in the memory cell arrays 5, the variation of the plate potential VPL of the buried plate-wiring 102 can be particularly suppressed, and the possibility that the data stored in the memory cell is damaged and the possibility that the capacitor dielectric film of the memory cell is damaged are reduced.

Then, a dynamic RAM according to a second embodiment of the present invention will be explained.

In the dynamic RAM according to the first embodiment described above, the BPT cell as shown in FIG. 3 is applied as the memory. cell having the buried plate-wiring. However, the memory cell having the buried plate-wiring is not limited to the BPT cell shown in FIG. 3. When the present invention is applied to the dynamic RAM in which the memory cell having the buried plate-wiring is integrated with the memory cell array, the similar effect to that of the above embodiment can be obtained.

As the memory cell having the buried plate-wiring, there is a buried strap type memory cell (hereinafter referred to as a "BEST cell") in addition to the BPT cell.

FIG. 21 is a sectional view of the BEST cell. The BEST cell will be simply explained.

As shown in FIG. 21, an N-type silicon region 402 to become a plate is formed in the substrate 1. The N-type silicon region 402 is a plate body and has a function for transmitting the plate potential VPL to the entire memory cell array, and hence can be considered as the similar region to the N-type buried plate-wiring 102 of the BPT cell. A P-type silicon region 404 is formed on the N-type silicon region 402. A trench 106 is formed from the surface of the P-type silicon region 404 to the midway of the N-type silicon region 402. A capacitor dielectric film 110 is formed in a collar state on the sidewall of the trench 106 in contact with the N-type silicon region 402. Further, thicker silicon oxide films ($SiO_2$) 108 than the capacitor dielectric film 110 are formed at the sidewall of the trench 106 in contact with the P-type silicon region 404 and the bottom of the trench 106. The trench 106 is buried with the storage node 112. Further, the storage node 112 is formed from the trench to the surface of the P-type silicon region 404 along the silicon oxide film 108 while being insulated from the P-type silicon region 404 by the silicon oxide film 108. The storage node 112 is capacitively coupled to the N-type silicon region 402 of the plate via the capacitor dielectric film 110. A silicon oxide film 114 is formed on the surface of the storage node 112. Further, an opening is provided at the silicon oxide film 108 of the side of the trench 106 under the silicon oxide film 114. The N-type silicon region 406 in contact with the opening is formed on the P-type silicon region 404. The storage node 112 is connected to the N-type silicon region 406 through the opening, and the N-type silicon region 406 is connected to the source of a cell transistor. Thus, the storage node 112 is connected to the source of the cell transistor.

The foregoing description is related to the BEST cell. The cell transistor is substantially the same as the conventional one. For instance, the word-line WL is formed on the P-type silicon region 404 between the source of the cell transistor and the drain of the cell transistor, and the drain of the cell transistor is connected to the bit-line BL (/BL). Incidentally, in FIG. 21, a bypass word-line is omitted.

FIGS. 22A to 22C are sectional views when the BEST cell is used as the memory cell array shown in FIG. 1; FIG. 22A is a sectional view schematically showing the configuration of a row decoder array 9-1; FIG. 22B is a sectional view schematically showing the configurations of a memory cell array 5-1 and a feeder block 13-1; and FIG. 22C is a sectional view schematically showing the configuration of a P-channel type sense amplifier driving circuit block 21-1.

As shown in FIGS. 22A to 22C, the same configuration as those shown in FIGS. 9A to 9C can be formed merely by altering the memory cell from the BPT cell to the BEST cell. Therefore, even in the dynamic RAM according to the second embodiment, the similar effect to that of the dynamic RAM according to the first embodiment described above can be obtained.

According to the second embodiment described above, as shown in FIG. 22B, the N-type silicon region 402 is formed of the deep well, the P-type silicon region 404 is formed of the shallow well, and the shallow well is so formed by displacing the portion of the deep well from the deep well as to be exposed from the surface of the substrate 1. The portion of the deep well exposed on the surface of the substrate 1 is formed as a feeder block 13. Thus, the necessity of newly forming the feeder can be eliminated, thereby usefully simplifying the manufacturing steps. In the configuration shown in FIG. 22B, even if the tap region 312 is not overlapped on the feeder block 13, the area increase in the row direction can be sufficiently suppressed.

FIGS. 22A to 22C illustrate the one example of the BEST cell, which may be other sectional structure. For example, the N-type silicon region 402 may be formed of a buried layer, or the N-type silicon region 402 may be formed as an N-type silicon substrate.

According to the present invention as described above, there is provided the semiconductor memory device comprising the connection node for connecting the buried plate-wiring to the plate potential supply-wiring without disturbing the integration density.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a semiconductor substrate having a memory cell array which includes a plurality of memory cells arranged in a matrix;
   a first word line having a first portion located in the memory cell array and a second portion located out of the memory cell array;
   a second word line located above said first word line;
   a tap region provided in said second portion of said first word line, said tap region connecting said second word line to said first word line; and
   a plurality of trench capacitors located in said memory cell array and out of said memory cell array, those of said trench capacitors which are located in said memory cell array constituting elements of said memory cells,
   wherein said tap region is located above at least one of those of said trench capacitors which is located out of said memory cell array.

2. The semiconductor memory device according to claim 1, wherein those of said trench capacitors which are located in said memory cell array are connected to one of a source and a drain of one of a plurality of transistors which utilizes said first word line as a gate.

3. The semiconductor memory device according to claim 2, wherein said transistors are located in a region other than said tap region.

4. The semiconductor memory device according to claim 1, wherein said memory cells are either BPT type memory cells or BEST type memory cells.

5. The semiconductor memory device according to claim 1, wherein a resistance of said second word line is lower than a resistance of said first word line.

6. The semiconductor memory device according to claim 1, further comprising a bit line provided between said first word line and said second word line.

7. The semiconductor memory device according to claim 6, wherein said bit line intersects said first word line.

8. The semiconductor memory device according to claim 7, wherein said first word line and said second word line extend in a same direction.

9. The semiconductor memory device according to claim 6, wherein those of the trench capacitors which are located in the memory cell array are connected to one of a source and a drain of one of a plurality of transistors which utilizes the first word line as a gate, and the other of the source and the drain of the transistors is connected to the bit line.

10. The semiconductor memory device according to claim 9, wherein said transistors are located in a region other than said tap region.

11. The semiconductor memory device according to claim 6, wherein said memory cells are either BPT type memory cells or BEST type memory cells.

12. The semiconductor memory device according to claim 6, wherein a resistance of said second word line is lower than a resistance of said first word line.

13. A semiconductor memory device comprising:
- a semiconductor substrate having a memory cell array which includes a plurality of memory cells arranged in a matrix;
- a word line having a first portion located in the memory cell array and a second portion located out of the memory cell array;
- a wiring line located above said word line;
- a tap region provided in said second portion of said word line, said tap region connecting said wiring line to said word line; and
- a plurality of trench capacitors located in said memory cell array and out of said memory cell array, those of said trench capacitors which are located in said memory cell array constituting elements of said memory cells, wherein said tap region is located above at least one of those of said trench capacitors which is located out of said memory cell array.

14. The semiconductor memory device according to claim 13, wherein those of the trench capacitors which are located in the memory cell array are connected to one of a source and a drain of one of a plurality of transistors which utilizes said word line as a gate.

15. The semiconductor memory device according to claim 14, wherein said transistors are located in a region other than said tap region.

16. The semiconductor memory device according to claim 13, wherein said memory cells are either BPT type memory cells or BEST type memory cells.

17. The semiconductor memory device according to claim 13, further comprising a bit line provided between said word line and wiring line.

18. The semiconductor memory device according to claim 14, wherein said bit line intersects said word line.

19. The semiconductor memory device according to claim 13, wherein those of the trench capacitors which are located in the memory cell array are connected to one of a source and a drain of one of a plurality of transistors which utilizes the word line as a gate, and the other of the source and the drain of said transistors is connected to said bit line.

20. The semiconductor memory device according to claim 19, wherein said transistors are located in a region other than said tap region.

21. The semiconductor memory device according to claim 17, wherein said memory cells are either BPT type memory cells or a BEST type memory cells.

* * * * *